United States Patent
Ruby

(10) Patent No.: US 8,922,302 B2
(45) Date of Patent: Dec. 30, 2014

(54) ACOUSTIC RESONATOR FORMED ON A PEDESTAL

(75) Inventor: Richard C. Ruby, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 579 days.

(21) Appl. No.: 13/216,633

(22) Filed: Aug. 24, 2011

(65) Prior Publication Data
US 2013/0049888 A1    Feb. 28, 2013

(51) Int. Cl.
| | | |
|---|---|---|
| H03H 9/05 | (2006.01) | |
| H03H 9/08 | (2006.01) | |
| H03H 3/02 | (2006.01) | |
| H03H 3/04 | (2006.01) | |
| H03H 9/17 | (2006.01) | |
| H03H 9/02 | (2006.01) | |

(52) U.S. Cl.
CPC ............... *H03H 3/04* (2013.01); *H03H 9/172* (2013.01); *H03H 9/02102* (2013.01); *H03H 9/0514* (2013.01); *H03H 9/02047* (2013.01); *H03H 9/02133* (2013.01)
USPC .......... 333/187; 310/348; 310/352; 29/25.35; 29/594

(58) Field of Classification Search
CPC .......... H03H 9/02047; H03H 9/02133; H03H 9/0504; H03H 9/172; H03H 9/173; H03H 9/54; H03H 9/582; H03H 9/586; H03H 9/587; H03H 9/60
USPC .......... 333/187–189, 133; 310/322, 334, 348, 310/349, 352; 29/25.35, 594
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |

(Continued)

FOREIGN PATENT DOCUMENTS

| | | |
|---|---|---|
| DE | 10160617 | 6/2003 |
| EP | 231892 | 8/1987 |

(Continued)

OTHER PUBLICATIONS

Co-pending U.S. Appl. No. 12/891,039, filed Sep. 27, 2010.

(Continued)

*Primary Examiner* — Barbara Summons

(57) ABSTRACT

An acoustic resonator structure comprises a substrate having a trench, a conductive pattern formed in the trench, a pillar formed within the trench, and an acoustic resonator supported at a central location by the pillar and suspended over the trench.

33 Claims, 22 Drawing Sheets

(56) References Cited

U.S. PATENT DOCUMENTS

| | | |
|---|---|---|
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,260,596 A | 11/1993 | Dunn et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,917,272 A | 6/1999 | Clark et al. |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita et al. |
| 5,977,840 A | 11/1999 | Connell et al. |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,338 A * | 8/2000 | Otsuchi et al. ............... 310/352 |
| 6,111,341 A | 8/2000 | Hirama |
| 6,111,480 A | 8/2000 | Iyama et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,196,059 B1 | 3/2001 | Koesslinger |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,292,336 B1 | 9/2001 | Horng et al. |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,679 B1 | 5/2002 | Lorenz |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,437,484 B1 | 8/2002 | Nishimura et al. |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |
| 6,507,983 B1 | 1/2003 | Ruby et al. |
| 6,509,813 B2 | 1/2003 | Ella et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,054 B2 | 4/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |
| 6,580,159 B1 | 6/2003 | Fusaro et al. |

(56) References Cited

U.S. PATENT DOCUMENTS

| | | |
|---|---|---|
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,635,519 B2 * | 10/2003 | Barber et al. ................. 438/151 |
| 6,639,872 B1 | 10/2003 | Rein |
| 6,650,205 B2 | 11/2003 | Goetz et al. |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 | 12/2003 | Ella et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Piazza et al. |
| 6,738,267 B1 | 5/2004 | Navas Sabater et al. |
| 6,762,471 B2 * | 7/2004 | Kim ............................. 257/414 |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,787,897 B2 | 9/2004 | Geefay et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,842,089 B2 | 1/2005 | Lee |
| 6,853,534 B2 | 2/2005 | Williams |
| 6,861,920 B2 | 3/2005 | Ishikawa et al. |
| 6,873,065 B2 | 3/2005 | Haigh et al. |
| 6,873,529 B2 | 3/2005 | Ikuta et al. |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,894,360 B2 | 5/2005 | Bradley |
| 6,894,588 B2 | 5/2005 | Detlefsen |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,919,222 B2 | 7/2005 | Geefay |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,933,809 B2 | 8/2005 | Kyoung et al. |
| 6,936,928 B2 | 8/2005 | Hedler et al. |
| 6,936,954 B2 | 8/2005 | Peczalski |
| 6,943,647 B2 | 9/2005 | Aigner |
| 6,943,648 B2 | 9/2005 | Maiz et al. |
| 6,946,928 B2 | 9/2005 | Larson, III et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,979,597 B2 | 12/2005 | Geefay et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,128,941 B2 | 10/2006 | Lee |
| 7,129,806 B2 | 10/2006 | Sato |
| 7,138,889 B2 | 11/2006 | Lakin |
| 7,161,283 B1 | 1/2007 | Geefay |
| 7,161,448 B2 | 1/2007 | Feng et al. |
| 7,170,215 B2 | 1/2007 | Namba et al. |
| 7,173,504 B2 | 2/2007 | Larson, III et al. |
| 7,187,254 B2 | 3/2007 | Su et al. |
| 7,209,374 B2 | 4/2007 | Noro |
| 7,212,083 B2 | 5/2007 | Inoue et al. |
| 7,212,085 B2 | 5/2007 | Wu |
| 7,221,242 B2 | 5/2007 | Asai |
| 7,230,509 B2 | 6/2007 | Stoemmer |
| 7,230,511 B2 | 6/2007 | Onishi et al. |
| 7,235,462 B2 | 6/2007 | Letertre et al. |
| 7,242,270 B2 | 7/2007 | Larson, III et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,312,675 B2 * | 12/2007 | Ruby et al. ................... 333/189 |
| 7,332,985 B2 | 2/2008 | Larson, III et al. |
| 7,345,409 B2 | 3/2008 | Leidl et al. |
| 7,345,410 B2 | 3/2008 | Grannen et al. |
| 7,358,831 B2 | 4/2008 | Larson et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,382,078 B2 | 6/2008 | Bradley |
| 7,385,467 B2 | 6/2008 | Stoemmer et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,408,428 B2 | 8/2008 | Larson, III |
| 7,414,349 B2 | 8/2008 | Sasaki |
| 7,414,495 B2 | 8/2008 | Iwasaki et al. |
| 7,423,503 B2 | 9/2008 | Larson, III et al. |
| 7,425,787 B2 | 9/2008 | Larson, III |
| 7,439,824 B2 | 10/2008 | Aigner |
| 7,563,475 B2 | 7/2009 | Ruby et al. |
| 7,619,493 B2 | 11/2009 | Uno et al. |
| 7,623,007 B2 * | 11/2009 | Nakatsuka et al. ........... 333/133 |
| 7,629,865 B2 | 12/2009 | Ruby |
| 7,714,684 B2 | 5/2010 | Ruby et al. |
| 7,791,434 B2 | 9/2010 | Fazzio et al. |
| 7,889,024 B2 | 2/2011 | Bradley et al. |
| 7,986,075 B2 | 7/2011 | Asai et al. |
| 8,188,810 B2 | 5/2012 | Fazzio et al. |
| 8,248,185 B2 | 8/2012 | Choy et al. |
| 2001/0028285 A1 | 10/2001 | Klee et al. |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0109565 A1 | 8/2002 | Ella et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0158702 A1 | 10/2002 | Tikka et al. |
| 2002/0158714 A1 | 10/2002 | Kaitila |
| 2002/0190814 A1 | 12/2002 | Yamada et al. |

(56) References Cited

U.S. PATENT DOCUMENTS

| | | |
|---|---|---|
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0205948 A1 | 11/2003 | Lin et al. |
| 2003/0213964 A1 | 11/2003 | Flynn et al. |
| 2004/0016995 A1 | 1/2004 | Kuo et al. |
| 2004/0017130 A1 | 1/2004 | Wang et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0188241 A1 | 9/2004 | Rich et al. |
| 2004/0195937 A1 | 10/2004 | Matsubara et al. |
| 2004/0212458 A1 | 10/2004 | Lee |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012571 A1* | 1/2005 | Song et al. ............... 333/192 |
| 2005/0012716 A1 | 1/2005 | Mikulin et al. |
| 2005/0023931 A1 | 2/2005 | Bouche et al. |
| 2005/0023932 A1 | 2/2005 | Inoue et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson, III et al. |
| 2005/0093399 A1 | 5/2005 | Inoue |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206483 A1 | 9/2005 | Pashby et al. |
| 2005/0218488 A1 | 10/2005 | Matsuo |
| 2005/0269904 A1 | 12/2005 | Oka |
| 2005/0275486 A1 | 12/2005 | Feng |
| 2006/0017352 A1 | 1/2006 | Tanielian |
| 2006/0071736 A1 | 4/2006 | Ruby et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0119453 A1 | 6/2006 | Fattinger et al. |
| 2006/0125489 A1 | 6/2006 | Feucht et al. |
| 2006/0132262 A1 | 6/2006 | Fazzio et al. |
| 2006/0164183 A1 | 7/2006 | Tikka et al. |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284707 A1 | 12/2006 | Larson, III et al. |
| 2006/0290446 A1 | 12/2006 | Aigner et al. |
| 2007/0035214 A1* | 2/2007 | Kasahara ............... 310/348 |
| 2007/0037311 A1 | 2/2007 | Izumi et al. |
| 2007/0040473 A1 | 2/2007 | Ballandras et al. |
| 2007/0069225 A1 | 3/2007 | Krames et al. |
| 2007/0069606 A1 | 3/2007 | Matsumoto et al. |
| 2007/0080759 A1 | 4/2007 | Jamneala et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0228876 A1 | 10/2007 | Sung |
| 2007/0266548 A1 | 11/2007 | Fattinger |
| 2007/0279153 A1 | 12/2007 | Ruby |
| 2008/0055020 A1 | 3/2008 | Handtmann et al. |
| 2008/0111651 A1 | 5/2008 | Isobe et al. |
| 2008/0258842 A1 | 10/2008 | Ruby et al. |
| 2008/0283944 A1* | 11/2008 | Geefay ............... 257/416 |
| 2008/0297279 A1 | 12/2008 | Thalhammer et al. |
| 2008/0297280 A1 | 12/2008 | Thalhammer et al. |
| 2008/0309432 A1 | 12/2008 | Fattinger et al. |
| 2009/0267457 A1 | 10/2009 | Barber et al. |
| 2010/0111808 A1 | 5/2010 | Pimputkar et al. |
| 2010/0176899 A1 | 7/2010 | Schaufele et al. |
| 2010/0187948 A1 | 7/2010 | Sinha et al. |
| 2010/0327697 A1 | 12/2010 | Choy et al. |
| 2010/0327994 A1 | 12/2010 | Choy et al. |
| 2011/0180391 A1 | 7/2011 | Larson et al. |
| 2012/0177816 A1 | 7/2012 | Larson et al. |
| 2012/0326807 A1 | 12/2012 | Choy et al. |
| 2013/0049888 A1 | 2/2013 | Ruby |
| 2013/0194057 A1* | 8/2013 | Ruby ............... 333/188 |

FOREIGN PATENT DOCUMENTS

| | | |
|---|---|---|
| EP | 0637875 | 2/1995 |
| EP | 689254 | 12/1995 |
| EP | 0865157 | 9/1998 |
| EP | 880227 | 11/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 0973256 | 9/2006 |
| EP | 2299593 | 3/2011 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 61054686 | 3/1986 |
| JP | 62-200813 | 9/1987 |
| JP | 1-295512 | 11/1989 |
| JP | 2-10907 | 1/1990 |
| JP | 06005944 | 1/1994 |
| JP | 8-330878 | 12/1996 |
| JP | 9-83029 | 3/1997 |
| JP | 10-32456 | 2/1998 |
| JP | 2000-31552 | 1/2000 |
| JP | 2000-232334 | 8/2000 |
| JP | 2001-102901 | 4/2001 |
| JP | 2001-508630 | 6/2001 |
| JP | 2002/217676 | 8/2002 |

(56) References Cited

FOREIGN PATENT DOCUMENTS

| | | |
|---|---|---|
| JP | 2003/124779 | 4/2003 |
| WO | WO-98/16957 | 4/1998 |
| WO | WO-98/56049 | 12/1998 |
| WO | WO-01/06646 | 1/2001 |
| WO | WO-01/06647 | 1/2001 |
| WO | WO-0199276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

Co-pending U.S. Appl. No. 13/162,883, filed Jun. 17, 2011.

U.S. Appl. No. 10/971,169, filed Oct. 22, 2004, Larson III, John D., et al.

Al-Ahmad, M. et al., "Piezoelectric-Based Tunable Microstrip Shunt Resonator", *Proceedings of Asia-Pacific Microwave Conference* 2006.

Ambacher, , "Growth and Applications of Group III-Nitrides", *J. Phys. D: Appl. Phys.* 31 1998, 2653-2710.

Aoyama, Takayuki at al., "Diffusion of Boron, Phosphorous, Arsenic and Antimony in Thermally Grown SiliconDioxide", *Journal of the Electrochemical Society*, vol. 146, No. 5 1999, 1879-1883.

Auld, B. A. , "Acoustic Resonators", *Acoustic Fields and Waves in Solids*, Second Edition, vol. II 1990, 250-259.

Bauer, L. O. et al., "Properties of Silicon Implanted with Boron Ions through Thermal Silicon Dioxide", *Solid State Electronics*, vol. 16, No. 3 Mar. 1973, 289-300.

Choi, Sungjin et al., "Design of Half-Bridge Piezo-Transformer Converters in the AC Adapter Applications", *APEC 2005, IEEE* Mar. 2005, 244-248.

Coombs, Clyde F., "Electronic Instrument Handbook", *Second Edition, McGraw-Hill, Inc.* 1995, pp. 5.1 to 5.29.

Dalmau, R. et al., "AlN Bulk Crystals Grown on CiC seeds", *Journal of Crystal Growth* 281 2005, 68-74.

Fattinger, G. G. et al., "Coupled Bulk Acoustic Wave Resonator Filters: Key technology for single-to-balanced RF filters", 0-7803-8331-1/4/W20.00; *IEEE MTT-S Digest* 2004, 927-929.

Hadimioglu, B. et al., "Polymer Films As Acoustic Matching Layers"., *1990 IEEE Ultrasonics Symposium Proceedings*, vol. 3 pp. [Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007 Dec. 1990, 1337-1340.

Hara, K. , "Surface Treatment of Quartz Oscillator Plate by Ion Implantation", *Oyo Buturi*, vol. 47, No. Feb. 2, 1978 , 145-146.

Holzlohner, Ronald et al., "Accurate Calculation of Eye Diagrams and Bit Error Rates in Optical Transmission Systems Using Linearization", *Journal of Lightwave Technology*, vol. 20, No. 3, Mar. 2002, pp. 389-400.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6. Nov. 2004.

Jiang, Yimin et al., "A Novel Single-Phase Power Factor Correction Scheme", *IEEE* 1993 , 287-292.

Jung, Jun-Phil et al., "Experimental and Theoretical Investigation on the Relationship Between AlN Properties and AlN-Based FBAR Characteristics", *2003 IEEE International. Frequency Control Symposium and PDA Exhibition Jointly with the 17th European Frequency and Time Forum* Sep. 3, 2003 , 779-784.

Kazinczi, R. et al., "Reliability Issues on MEMS Resonators", *Delft University of Technology, DIMES; Faculty of Information Technology and Systems; Department of Electrical Engineering; Laboratory of Electronic Instrumentation*, Mekelweg 4, 2628 CD Delft, the Netherlands.

Krishnaswamy, S.V. et al., "Film Bulk Acoustic Wave Resonator Technology", May 29, 1990, 529-536.

Lakin, K.M. , "Bulk Acoustic Wave Coupled Resonator Filters", *2002 IEEE International Frequency Control Symposium and PDA Exhibition* May 2002, 8-14.

Lakin, K.M. , "Coupled Resonator Filters", *2002 IEEE Ultrasonics Symposium* Mar. 2, 2002, 901-908.

Lakin, K.M. et al., "High Performance Stacked Crystal Filters for GPS and Wide Bandwidth Applications", *2001 IEEE Ultrasonics Symposium* Jan. 1, 2001, 833-838.

Lakin, K. M. et al., "Temperature Compensated Bulk Acoustic Thin Film Resonators", *IEEE Ultrasonics Symposium*, San Juan, Puerto Rico Oct. 2000, 855-858.

Lakin, K.M. , "Thin Film BAW Filters for Wide Bandwidth and High Performance Applications", *IEEE Microwave Symposium Digest;* vol. 2 Jun. 6-11, 2004, 923-926.

Lakin, K. M., "Thin Film Resonators and Filters", *IEEE Untrasonics Symposium*, Caesar's Tahoe, NV Oct. 1999, 895-906.

Lakin, et al., "Wide Bandwidth Thin Film BAW Filters", *2004 IEEE Ultrasonics Symposium*, vol. 1, Aug. 2004, 407-410.

Larson III, John D. et al., "Measurement of Effective Kt2,Q,Rp,Rs vs. Temperature for Mo/AlN FBAR Resonators", *IEEE Ultrasonics Symposium* 2002, 939-943.

Li, Yunxiu et al., "AC-DC Converter with Worldwide Range Input Voltage by Series and Parallel Piezoelectric Transformer Connection", *35th Annual IEEE.Power Electronics Specialists Conference* 2004.

Lobl, H.P. et al., "Piezoelectric Materials for BAW Resonators and Filters", *2001 IEEE Ultrasonics Symposium* Jan. 1, 2001, 807-811.

Martin, Steven J. et al., "Development of a Low Dielectric Constant Polymer for the Fabrication of Integrated Circuit Interconnect", *12 Advanced Materials* Dec. 23, 2000, 1769-1778.

Murphy, M.J. et al., "Normal and Inverted Algan/Gan Based Piezoelectric Field Effect Transistors Grown by Plasma Induced Molecular Beam Epitaxy", *MRS Internet J. Nitride Semicond.* Res. 4S1, G8.4 1999.

Navas, J. et al., "Miniaturised Battery Charger using Piezoelectric Transformers", *IEEE* 2001, 492-496.

Ng, J. et al., "The Diffusion Ion-Implanted Boron in Silicon Dioxide", *AIP Conf. Proceedings*, No. 122 1984, 20-33.

Ohta, S. et al., "Temperature Characteristics of Solidly Mounted Piezoelectric Thin Film Resonators", *IEEE Ultrasonics Symposium*, Honolulu, HI Oct. 2003, 2011-2015.

Pang, W. et al., "High Q Single-Mode High-Tone Bulk Acoustic Resonator Integrated With Surface-Machined FBAR Filter", *Microwave Symposium Digest, IEEE MTT-S International* 2005 , 413-416.

Paranjpe, et at., "Atomic Layer Deposition of AlOx for Thin Film Head Gap Applications", *Journal of the Electrochemical Society* 148 2001, G465-G471.

Parker, T. E. et al., "Temperature-Compensated Surface Acoustic-Wave Devices with SiO2 Film Overlays", *J. Appl. Physics*, vol. 50 1360-1369, Mar. 1979.

Pensala, et al., "Spurious resonance supression in gigahertz-range ZnO thin-film bulk acoustic wave resonators by the boundary frame method: modeling and experiment", *IEEE Transactions on Ultrasonics, Ferroelectrics, and Frequency Control*, vol. 56, No. 8 Aug. 2009, 1731-1744.

Pensala, "Thin film bulk acoustic wave devices: performance optimization and modeling", http://www.vtt.fi/inf/pdf/publications/2011/P756.pdf.

Picosun, "Atomic Layer Deposition—The basic principles, film materials, and applications", date unknown.

Puurunen, "Preparation by Atomic Layer Deposition and Characterisation of Catalyst Supports Surfaced with Aluminum Nitride", *Dissertation for the Degree of Doctor of Science in Technology*, Helsinki University of Technology, Espoo, Finland. Oct. 25, 2002.

(56) References Cited

OTHER PUBLICATIONS

Reinhardt, Alexandre at al., "Design of Coupled Resonator Filters Using Admittance and Scattering Matrices", *2003 IEEE Ultrasonics Symposium* May 3, 2003, 1428-1431.

Ruby, R. C., "MicroMachined Thin Film Bulk Acoustic Resonators", *IEEE International Frequency Control Symposium 1994*, 135-138.

Ruby, R. et al., "The Effect of Perimeter Geometry on FBAR Resonator Electrical Performance", *Microwave Symposium Digest, 2005 IEEE MTT-S International* Jun. 12, 2005, 217-221.

Sanchez, A.M. et al., "Mixed Analytical and Numerical Design Method for Piezoelectric Transformers", *IEEE Xplore* 2003, 841-846.

Schuessler, Hans H., "Ceramic Filters and Resonators", *Reprinted from IEEE Trans. Sonics Ultrason.*, vol. SU-21 Oct. 1974, 257-268.

Spangenberg, B. et al., "Dependence of the Layer Resistance of Boron Implantation in Silicon and the Annealing Conditions", *Comptus Rendus de l'Academic Bulgare des Sciences*, vol. 33, No. 3 1980, 325-327.

Stutzman, M. et al., "Playing with Polarity", *Phys. Stat. Sol.* (b) 228, No. 2. 2001, 505-512.

Tiersten, H. F. et al., "An Analysis of Thickness-Extensional Trapped Energy Resonant Device Structures with Rectangular Electrodes in the Piezoelectric Thin Film on Silicon Configuration", *J. Appl. Phys.* 54 (10) Oct. 1983, 5893-5910.

Topich, J. A. et al., "Effects of Ion Implanted Fluorine in Silicon Dioxide", *Nuclear Instr. and Methods, Cecon Rec,* Cleveland, OH May 1978, 70-73.

Tsubbouchi, K. et al., "Zero Temperature coefficient Surface Acoustic Wave Devices using Epitaxial AIN Films", *IEEE Ultrasonic symposium,* San Diego, CA, 1082 1982, 240-245.

Vasic, D et al., "A New Method to Design Piezoelectric Transformer Used in MOSFET & IGBT Drive Circuits", *IEEE 34th Annual Power Electronics Specialists Conference,* 2003 vol. 1 Jun. 15-19, 2003, 307-312.

Vasic, D et al., "A New MOSFET & IGBT Gate Drive Insulated by a Piezoelectric Transformer", *IEEE 32 nd Annual Power Electronics Specialists Conference,* 2001 vol. 3 2001, 1479-1484.

Yang, C.M. et al., "Highly C Axis Oriented AIN Film Using MOCVD for 5GHx Band FBAR Filter", *2003 IEEE Ultrasonics Symposium* Oct. 5, 2003, pp. 170-173.

Co-pending U.S. Appl. No. 13/662,460, filed Oct. 27, 2012.

Unkrich, "FBAR Resonator Mechanical Stress Relief", IP.com No. IPCOM000214956D, IP.com Electronic Publication, Feb. 15, 2012.

Jha, et al., "Thermal Isolation Of Encapsulated MEMS Resonators", Journal Of Microelectromechanical Systems, vol. 17, No. 1, Feb. 2008, 175-184.

Ruby, "Micromachined Cellular Filters", Hewlett-Packard Laboratories, Hewlett-Packard, Palo Alto, CA 94304, 1996 IEEE MTT-S Digest, 1149-1152.

Vig, "Introduction To Quartz Frequency Standards", Research And Development Technical Report SLCET-TR-92-1 (Rev. 1), Distribution Statement, Army Research Laboratory, Electronics And Power Sources Directorate, Fort Monmouth, NY 07703-5601, U.S.A., Oct. 1992, 56 pages.

\* cited by examiner

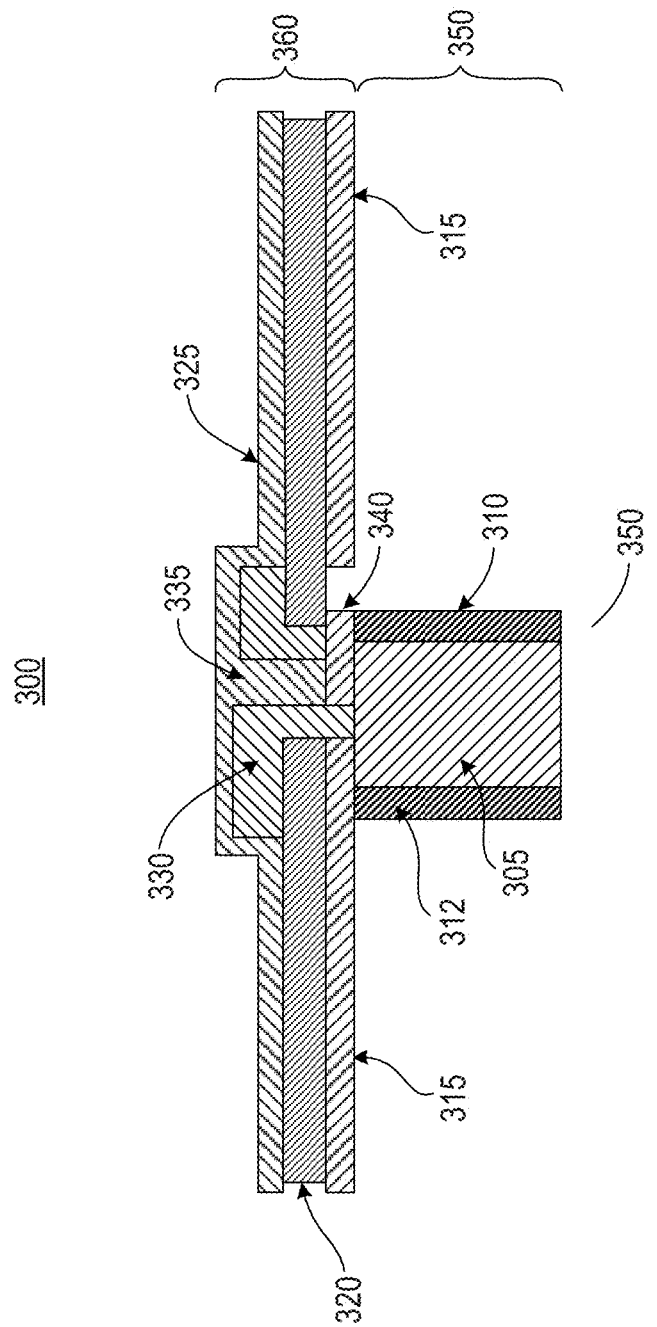

ACOUSTIC RESONATOR FORMED ON A PEDESTAL

BACKGROUND

Acoustic resonators are used to filter electrical signals in various electronic applications. For example, acoustic resonators are used as bandpass filters in cellular phones, global positioning system (GPS) devices, and imaging applications, to name but a few.

An acoustic resonator can be characterized generally by a center frequency and bandwidth. However, due to a variety of intrinsic and extrinsic influences, the center frequency and bandwidth can drift over time—a process referred to as frequency drift, or more generally "aging."

One cause of aging in acoustic resonators is physical stress. Physical stress can be caused, for example, by forces transmitted to the acoustic resonator through adjacent components. As an example, an acoustic resonator can be mounted on a printed circuit board (PCB) comprising metal and laminate components. As the PCB is heated or cooled, the PCB may expand or contract unevenly because the metal and laminate components have different temperature coefficients of expansion. This uneven expansion or contraction can cause the PCB to change shape in a "potato chip" fashion. As the PCB changes shape, the PCB can transfer forces to the acoustic resonator through various intervening components, such as an epoxy bonding material or a silicon microcap. As these forces are transferred to the acoustic resonator, they will change the center frequency of the acoustic resonator. Although the frequency change is relatively small, it is significant in terms of other sources of aging such as the electrode metal relaxation effect associated with quartz crystal aging.

FIG. 1A is a diagram illustrating forces applied to a conventional acoustic resonator structure 100. For explanation purposes, it will be assumed that acoustic resonator structure 100 is located in a chip scale package mounted on a PCB. Forces are applied to the package from the PCB, and from the package to acoustic resonator structure 100 as indicated by arrows in FIG. 1A.

The forces shown in FIG. 1A can originate from various sources. For example, forces can originate from a PCB that has been warped in response to temperature changes, as described above. Alternatively, forces could originate from a PCB that has been bent when clamped to a chassis or another motherboard, or from the soldering of the package onto a PCB.

Referring to FIG. 1A, acoustic resonator structure 100 comprises a silicon substrate 105 located within the package, and a film bulk acoustic resonator (FBAR) 115 formed on substrate 105. An air gap 110 is formed between substrate 105 and FBAR 115 so that FBAR 115 can resonate freely.

Curved lines 120 represent the interface of the mounted resonator shown with other structures such as a printed circuit (pc) board, packaging, etc. Forces created by, or presented to these structures can be present. These forces can be transferred from the package to substrate 105 through various intervening features, such as an epoxy bonding or microcap structure (not shown). The transferred forces create stresses 125 on substrate 105. Stresses 125 propagate through substrate 105 and other features to create stresses 130 where FBAR 115 is connected to substrate 105. Stresses on 130 exert torque on FBAR 115, which can change the center frequency on the FBAR 115.

FIG. 1B is a diagram illustrating a simulation of forces transferred from substrate 105 to FBAR 115. As illustrated in FIG. 2, the forces on substrate 105 cause stress at an edge of FBAR 115. The stress is transmitted horizontally through FBAR 115, which can affect the resonance of the FBAR 115, as explained above.

FIG. 2 is a graph illustrating changes of the center frequency of a conventional acoustic resonator structure as a function of temperature. These changes are caused by stresses on the acoustic resonator due to the changing temperature. The graph of FIG. 2 was generated with a so-called zero drift resonator (ZDR) mounted on a PCB in laboratory conditions. A resonator under real-life conditions may experience even more frequency drift than that illustrated in FIG. 2.

Referring to FIG. 2, the ZDR was heated from an initial temperature of approximately 70° C. to a temperature of approximately 130° C. The resonator was then cooled to approximately 25° C. and heated back to approximately 70° C. The center frequency of the acoustic resonator changed by approximately −50 ppm when the temperature was raised from 70° C. to 130° C. Then, as the temperature was cooled back to 70° C., the center frequency passed through a point at 0 ppm, which is offset from the original center frequency by approximately 20 ppm. As illustrated by the different center frequencies exhibited at 70° C., the center frequency of the acoustic resonator exhibits both temperature dependence as well as temperature based hysteresis. The parabolic temperature dependence is a property of the stiffness of the materials present in the acoustic stack of the ZDR and can be compensated elsewhere in the circuit. But, the hysteresis is created by variations in applied forces to the substrate. One cause for the change in force is that the epoxy (a hydrophilic material) outgases moisture and as the epoxy becomes more desiccated, it shrinks and thus applies a different force to the mounted ZDR.

The frequency changes shown in FIG. 2 may be too large for certain high accuracy electronic applications. For example, GPS devices can only tolerate aging-related frequency changes on the order of +/−0.5 ppm. Similarly, wireless applications, such as low power radios used in WiFi or Bluetooth can only tolerate aging-related frequency changes on the order of +/−10 ppm.

What is needed, therefore, are techniques for reducing frequency drift due to physical stresses in acoustic resonator structures.

BRIEF DESCRIPTION OF THE DRAWINGS

The described embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 3 is a diagram illustrating an acoustic resonator structure according to a representative embodiment.

DETAILED DESCRIPTION

Figure 1A:
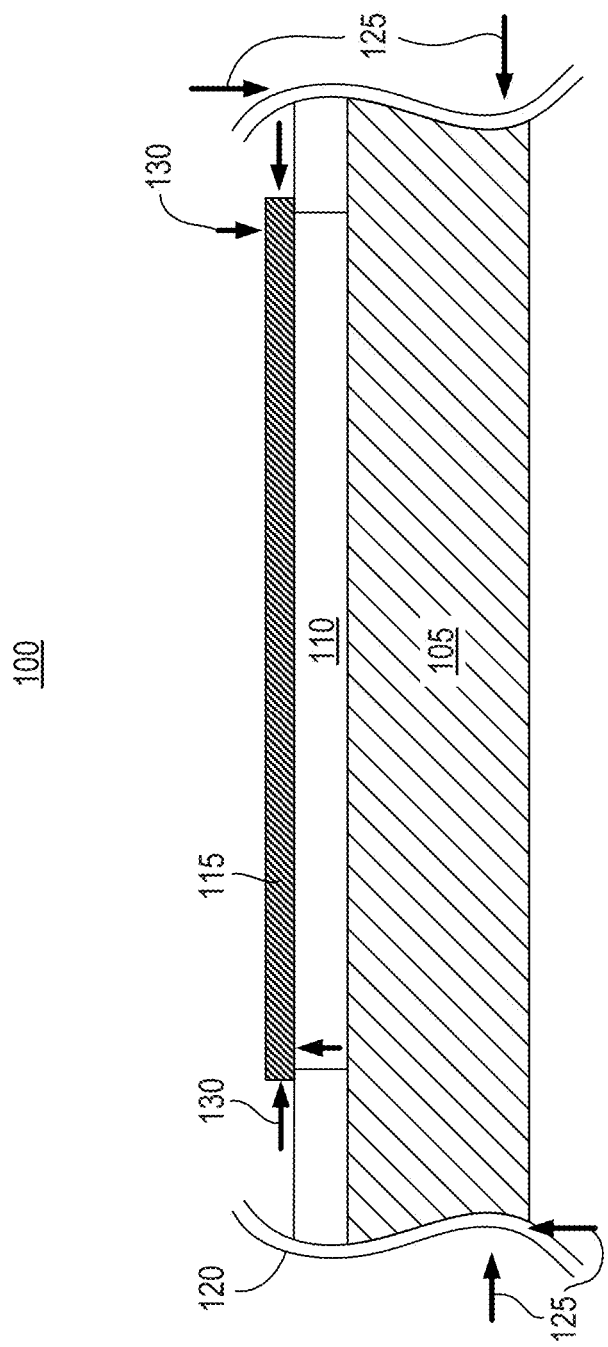
FIG. 1A is a diagram illustrating forces applied to a known acoustic resonator structure.
Figure 1B:
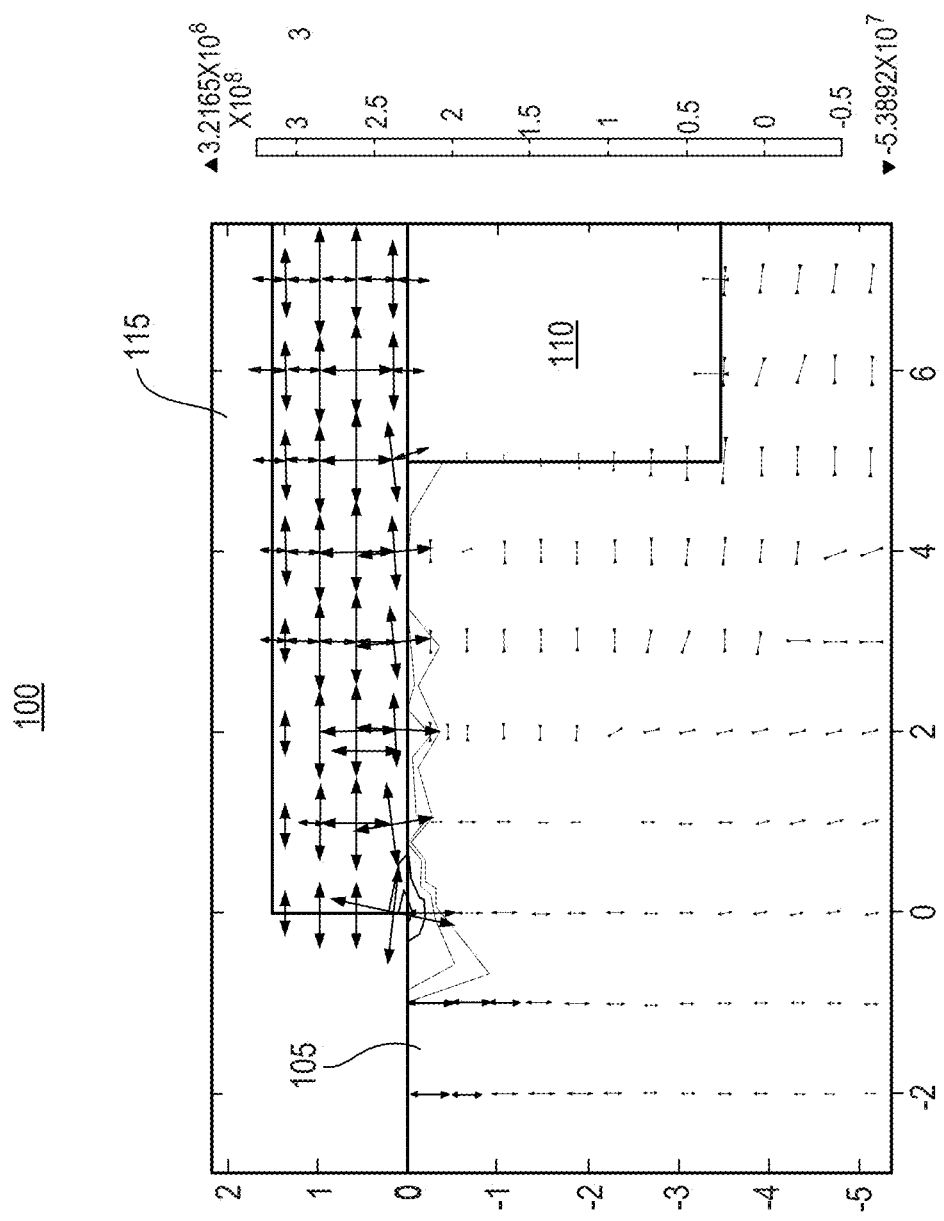
FIG. 1B is a diagram illustrating a simulation of forces transferred from a substrate to an FBAR in the acoustic resonator structure of FIG. 1A.
Figure 2:
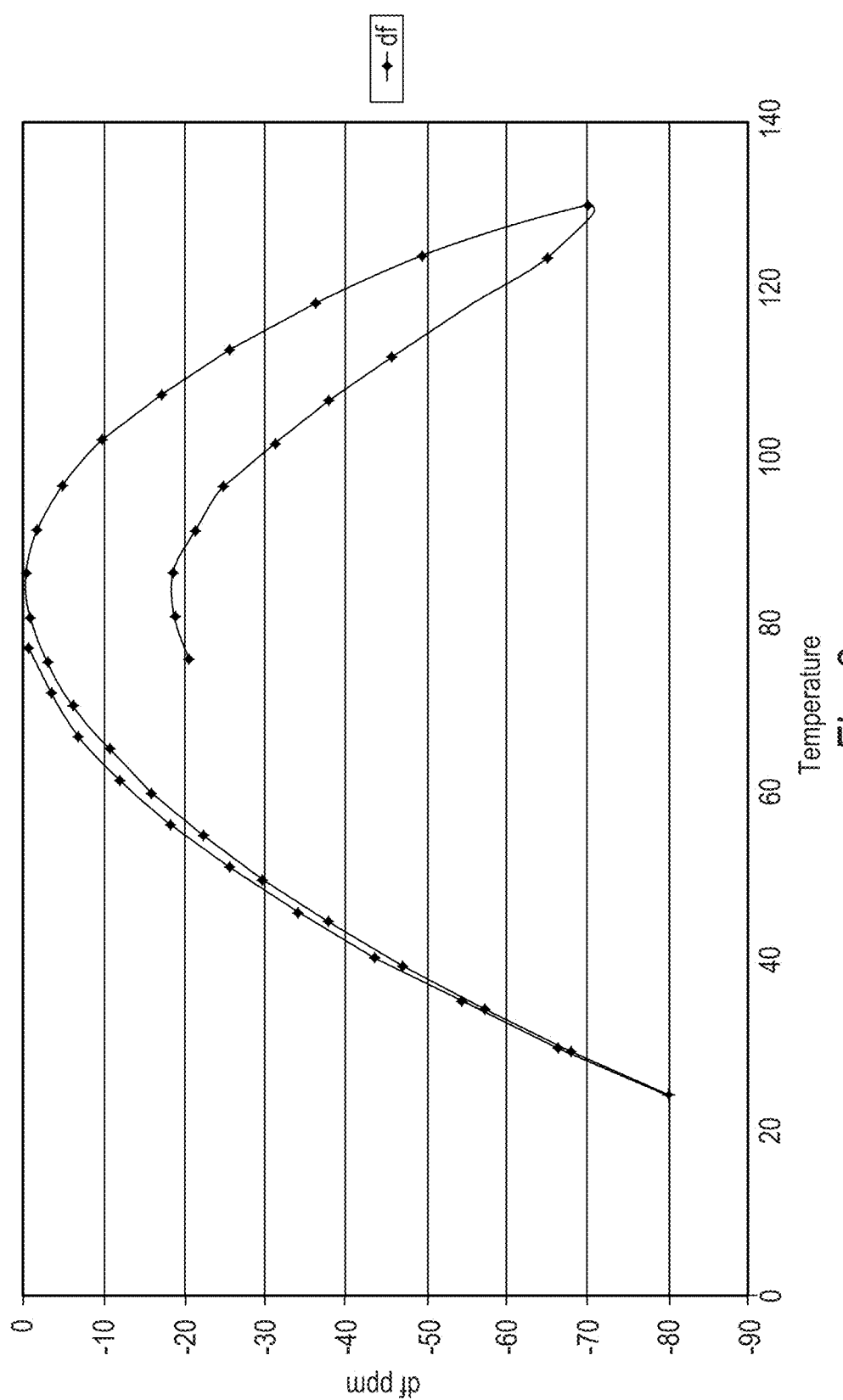
FIG. 2 is a graph illustrating changes of the center frequency of a conventional acoustic resonator structure as a function of temperature.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. In addition, unless expressly so defined herein, terms are not to be interpreted in an overly idealized fashion. For example, the terms "isolation" or "separation" are not to be interpreted to require a complete lack of interaction between the described features.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same. The present teachings relate generally to bulk acoustic wave (BAW) resonator structures. These resonator structures can include various types of acoustic resonators, such as, for example, FBARs, ZDRs, double bulk acoustic resonators (DBARs), and coupled resonator filters (CRFs). In certain embodiments, the BAW resonator structures can be used to provide electrical filters (e.g., ladder filters). In addition, in certain embodiments one or more acoustic resonators can be coupled to a circuit in an "FMOS" configuration, for example as described in commonly owned U.S. patent application Ser. No. 12/891,039, entitled "Packaged Device with Acoustic Resonator and Electronic Circuitry and Method of Making the Same" filed on Sep. 27, 2010, to Ruby, et al.; and Ser. No. 13/162,883 entitled "Capacitance Detector for Accelerometer and Gyroscope and Accelerometer and Gyroscope with Capacitance Detector" filed on Jun. 17, 2011 to Ruby, et al. The disclosures of these patent applications are specifically incorporated herein by reference as if set forth herein.

Certain details of BAW resonators, BAW resonator filters, related materials, and methods of fabrication may be found in one or more of the following commonly owned U.S. Patents and Patent Application Publications: U.S. Pat. No. 6,107,721, to Lakin; U.S. Pat. Nos. 5,587,620, 5,873,153, 6,060,818 and 6,507,983 to Ruby, et al.; U.S. Pat. No. 7,629,865 to Ruby, et al.: U.S. Pat. No. 7,280,007 to Feng, et al.; U.S. Patent Application Publication No. 20070205850 to Jamneala, et al.: U.S. Patent Application Publication No. 20060071736 to Ruby, et al; U.S. Patent Application Publication No. 20100327697 to Choy, et al.; and U.S. Patent Application Publication No. 20100327994 to Choy, et al. Examples of stacked bulk acoustic resonators, as well as their materials and methods of fabrication, may be found in U.S. Pat. No. 7,889,024 to Bradley et al. The disclosures of these patents and patent applications are specifically incorporated herein by reference as if set forth herein. It is emphasized that the components, materials and method of fabrication described in these patents and patent applications are representative and other methods of fabrication and materials within the purview of one of ordinary skill in the art are contemplated.

Certain embodiments described below relate to an acoustic resonator structure comprising an acoustic resonator formed on a pedestal. The pedestal supports the acoustic resonator such that forces transmitted to the pedestal produce minimal physical stress on the acoustic resonator. In other words, the pedestal mechanically isolates the acoustic resonator to prevent the acoustic resonator from being influenced by surrounding forces. In this manner, the pedestal reduces the amount of frequency drift in the acoustic resonator due to physical stress.

Certain embodiments described below can be used in electronic applications such as low power radios for wireless applications, GPS devices, and imaging devices, to name but a few. Some embodiments are particularly relevant to high accuracy devices requiring filters with minimal frequency drift. For example, some embodiments can be used to displace existing technologies such as existing Quartz based oscillators used in GPS devices. In addition, some embodiments also provide thermal isolation by forming the pedestal of a material having low thermal conductivity, which can allow the resonators to be used in thermally dynamic environments.

FIG. 3 is a diagram illustrating an acoustic resonator structure 300 according to a representative embodiment.

Referring to FIG. 3, acoustic resonator structure 300 comprises a pedestal 350, and an acoustic resonator 360 attached to pedestal 350 at a central location. Acoustic resonator 360 is formed in an annular shape around pedestal 350.

Pedestal 350 comprises a pillar 305, a first contact 310 and a second contact 312. First and second contacts 310 and 312 are typically formed of an electrically conductive material such as tungsten or molybdenum. First and second contacts 310, 312 are electrically isolated from each other so that first contact 310 forms a first conductive path connected to acoustic resonator 360, and second contact 312 forms a second conductive path connected to acoustic resonator 360.

Pillar 305 is illustratively silicon and typically forms part of an etched silicon wafer, as illustrated for example in FIG.

4. In some embodiments, pillar 305 can be replaced with a pillar formed of a material having lower thermal conductivity than silicon, such as a non-conductive oxide. This replacement of pillar 305 can provide improved thermal insulation for acoustic resonator 360. Illustrative examples of such a non-conductive oxide include but are not limited to silicon dioxide, which has much greater thermal resistance than pure silicon, or non-etchable boro-silica glass (NEBSG). Other materials within the purview of one of ordinary skill in the art having the benefit of the present disclosure are also contemplated for use as the materials of the pillar 305.

Acoustic resonator 360 comprises a lower electrode 315, a piezoelectric layer 320, and an upper electrode 325. At the same time that the lower electrode 315 is deposited and patterned, an 'island' electrode 340 is formed covering a portion of the pedestal 350. As depicted in FIG. 3, the island electrode 340 is electrically isolated from lower electrode 315, and provides a conductive path between the upper electrode 325 and first contact 310. Lower and upper electrodes 315 and 325 and island electrode 340 are typically formed of a conductive material such as molybdenum or tungsten, or other materials described in certain referenced U.S. Patents, U.S. Patent Application Publications, and U.S. Patent Applications referenced above. Piezoelectric layer 320 can comprise, for example, aluminum nitride (AlN), zinc oxide (ZnO), or lead zirconium titanate (PZT). The piezoelectric layer 320 comprises a highly-textured c-axis piezoelectric material. Notably, in a highly textured c-axis piezoelectric material, the c-axis orientations of the crystals of the piezoelectric material are well-collimated, and as such are parallel with one another and perpendicular to the plane of the electrodes (e.g., lower and upper electrodes 315, 325).

Lower electrode 315 is electrically connected to second contact 312 on the left side of pedestal 350, and upper electrode 325 is electrically connected to first contact 310 on the right side of pedestal 350 through the island electrode 340. More specifically, lower electrode 315 is in direct contact with second contact 312, while upper electrode 325 is connected to first contact 310 through island electrode 340. Although lower electrode 315 is shown as two discontinuous sections with pedestal 350 therebetween, these sections are electrically connected and represent a single annulus.

Illustratively, the electrical connection between upper electrode 325 and first contact 310 is formed by a via 335 that connects to the island electrode 340 formed on pedestal 350 to a top portion of acoustic resonator 360. Island electrode 340 is typically formed of the same layer as lower electrode 315, but is electrically isolated from lower electrode 315. In other words, island electrode 340 can be viewed as a conductive island formed by removing a surrounding portion of lower electrode 315.

A spacer 330 is formed in a cavity between via 335 and piezoelectric layer 320. In some embodiments, spacer 330 is formed of a suitable dielectric material such as non-etchable borosilicate glass (NEBSG). In other embodiments, spacer 330 comprises an air cavity. Among other functions, spacer 330 functions to substantially prevent resonances from being generated above pedestal 350. The spacer 330 also has an annular shape and ensures that the upper electrode 325 does not form a parasitic resonance with the portion of the lower electrode 315 disposed beneath the spacer 330. Notably, the active area of the acoustic resonator 360 includes only the region where the lower and upper electrodes 315, 325 and piezoelectric layer 320 overlap and are in intimate contact with one another. As such, spacer 330 substantially prevents spurious modes from being generated between an area of lower electrode 315 directly above second contact 312, and a portion of metal connecting via 335 to the left side of upper electrode 325.

Acoustic resonator 360 has an active region defined by an overlap between lower electrode 315, the piezoelectric layer 320 and the upper electrode 325. As illustrated in FIG. 3, spacer 330 extends laterally so that no portion of upper electrode 325 is formed above pedestal 350. This allows the acoustic resonator 360 to resonate freely (i.e., substantially undamped) so that minimal energy is absorbed by pedestal 350.

During typical operation, an electrical input signal is applied between the lower electrode 315 and the upper electrode 325, causing piezoelectric layer 320 to mechanically expand and contract. As described in U.S. Patents, U.S. Patent Application Publications, and U.S. Patent Applications referenced above, longitudinal bulk acoustic waves (also referred to as longitudinal modes or thickness extensional modes) propagate through piezoelectric layer 320 and generate a corresponding electrical output signal on upper electrode 325. Notably, known structures and methods to improve the performance of the acoustic resonator 360 are contemplated by the present teachings. For example, lower and upper electrodes 315 and 325 may be apodized, and frame elements may be provided in the structure. Certain known structures and methods useful in improving the performance of the acoustic resonator are described, for example, in U.S. Patents, U.S. Patent Application Publications, and U.S. Patent Applications referenced above.

Figure 4A:
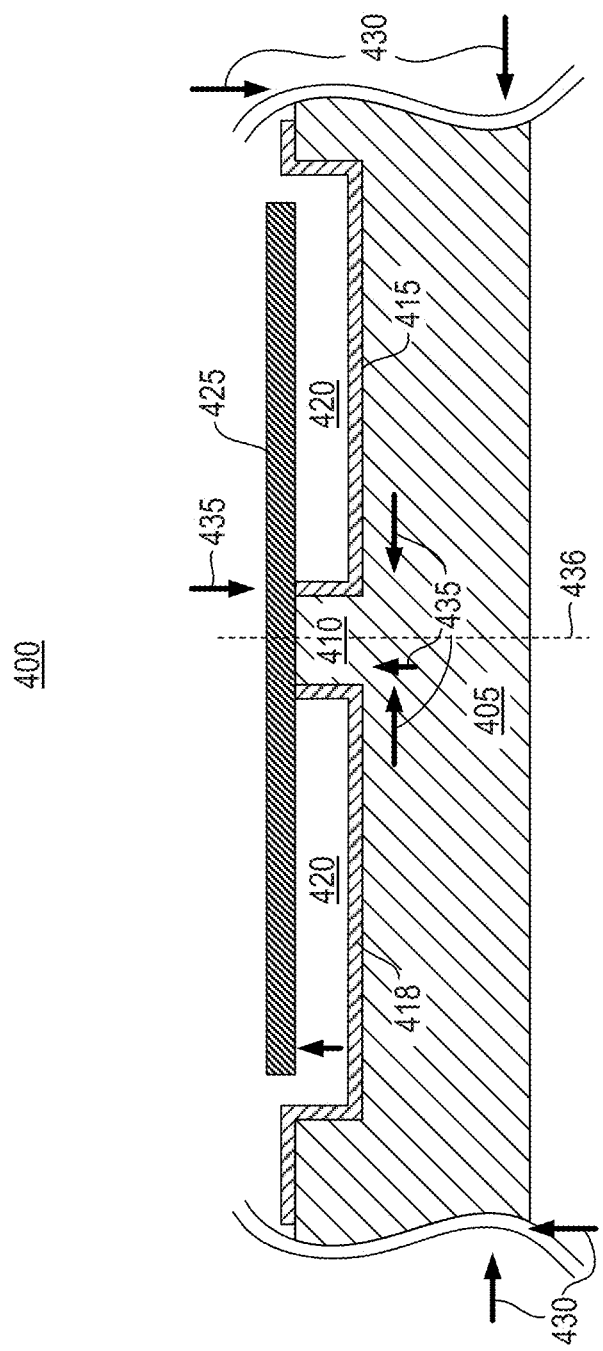
FIG. 4A is a diagram illustrating an acoustic resonator structure according to a representative embodiment.

FIG. 4A is a diagram illustrating an acoustic resonator structure 400 according to a representative embodiment. In FIG. 4, a force field is shown to illustrate how a pedestal beneficially mechanically isolates the acoustic resonator structure 400 from surrounding features.

Referring to FIG. 4A, acoustic resonator structure 400 comprises a substrate 405. Substrate 405 can be formed of various types of semiconductor materials compatible with semiconductor processes, such as silicon, gallium arsenide, indium phosphide, or the like, which is useful for integrating connections and electronics, thus reducing size and cost.

A pair of trenches 420 is formed in substrate 405, and a pillar 410 (e.g., silicon or other material used for the substrate 405) is formed between trenches 420. Due to their shape, trenches 420 may be referred to alternatively as a "swimming pool" structure by those of ordinary skill in the art.

First and second electrical contacts 415 and 418 are provided within trenches 420, and an acoustic resonator 425 is formed above trenches 420 and pillar 410. Acoustic resonator 425 can be any type of bulk acoustic resonator. For example, acoustic resonator 425 can be an FBAR, DBAR, CRF, or ZDR. For explanation purposes however, acoustic resonator 425 is illustratively an FBAR. In addition, although not depicted in detail in FIG. 4A, acoustic resonator 425 comprises a lower electrode connected to a first contact on the pillar 410 that is connected to the first electrical contact 415, an upper electrode connected to a second contact on the pillar 410 that is connected to the second electrical contact 418, and a piezoelectric layer between the lower and upper electrodes. These electrodes can be connected to first and second electrical contacts 415 and 418 in a manner similar to the connection between first and second contacts 310 and 312 and lower and upper electrodes 315 and 325 in FIG. 3.

First and second electrical contacts 415 and 418, as well as the lower and upper electrodes of acoustic resonator 425, can be formed of various conductive materials, such as metals compatible with semiconductor processes, including tungsten, molybdenum, aluminum, platinum, ruthenium, niobium, or hafnium, for example. These features can also be formed with conductive sub-layers or in combination with other types of layers, such as temperature compensating layers. In addition, they can be formed of the same material, or they can be formed of different materials.

The upper electrode of acoustic resonator 425 can further comprise a passivation layer (not shown), which can be formed of various types of materials, including aluminum nitride, silicon carbide, BSG, $SiO_2$, SiN, polysilicon, and the like. The thickness of the passivation layer should generally be sufficient to insulate the layers of acoustic resonator 425 from the environment, including protection from moisture, corrosives, contaminants, and debris.

A force field from intrinsic and/or extrinsic stimuli creates forces 430 on substrate 405. These stimuli can be caused by various factors, such as thermal expansion or contraction of a PCB connected to acoustic resonator structure 400, or attachment of a package containing acoustic resonator structure 400 to the PCB.

Forces 430 are transmitted through silicon substrate to create forces 435 on pillar 410. However, because acoustic resonator 425 is connected to pillar 410 at a single central location, forces 435 are unable to exert any appreciable torque on acoustic resonator 425. Consequently, forces 435 have minimal impact on the frequency of acoustic resonator 425. In other words, forces 435 have much less influence on the center frequency of acoustic resonator 425 compared with forces 130 of FIG. 1A.

Figure 4B:
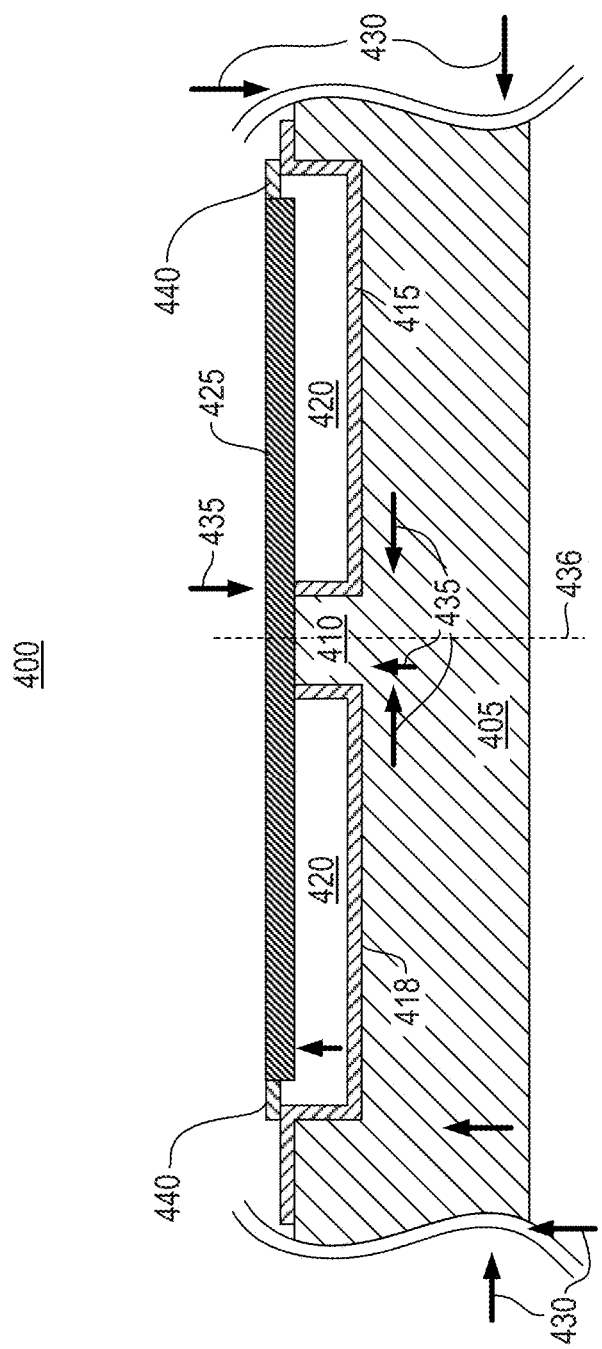
FIG. 4B is a diagram illustrating an acoustic resonator structure according to a representative embodiment.

FIG. 4B is a diagram illustrating a modified version of acoustic resonator structure 400 according to another representative embodiment. The structure shown in FIG. 4B is essentially identical to that illustrated in FIG. 4A, except that the structure of FIG. 4B further comprises tethers 440. Tethers 440 can be used to provide increased structural stability for acoustic resonator 425. Tethers 440 can be attached between first and second electrical contacts 415 and 418 and outer edges of acoustic resonator 425. Alternatively, the tethers 440 can be electrically isolated from the first and second electrical contacts 415 and 418. Moreover, tethers 440 can be connected to or formed by electrical traces (not shown) provided over the substrate 405 enabling selective electrical connections to be made to the acoustic resonator 425 suspended over the trench 420.

Although not shown in FIGS. 4A and 4B, acoustic resonator structure 400 is typically covered by a microcap structure bonded to substrate 405. The microcap structure can be formed of etched silicon or another material and enables hermetic sealing of the acoustic resonator 425. Additional details of methods, materials and assembly of a microcap structure to a base substrate may be found, for example in one or more of commonly owned U.S. Pat. Nos. 6,228,675; 6,265, 246; 6,429,511; 6,787,897; 6,919,222; 6,979,597; and 7,161, 283, the disclosures of which are hereby incorporated by reference as if set forth herein. In some embodiments, however, the microcap structure can be omitted.

Figure 4C:
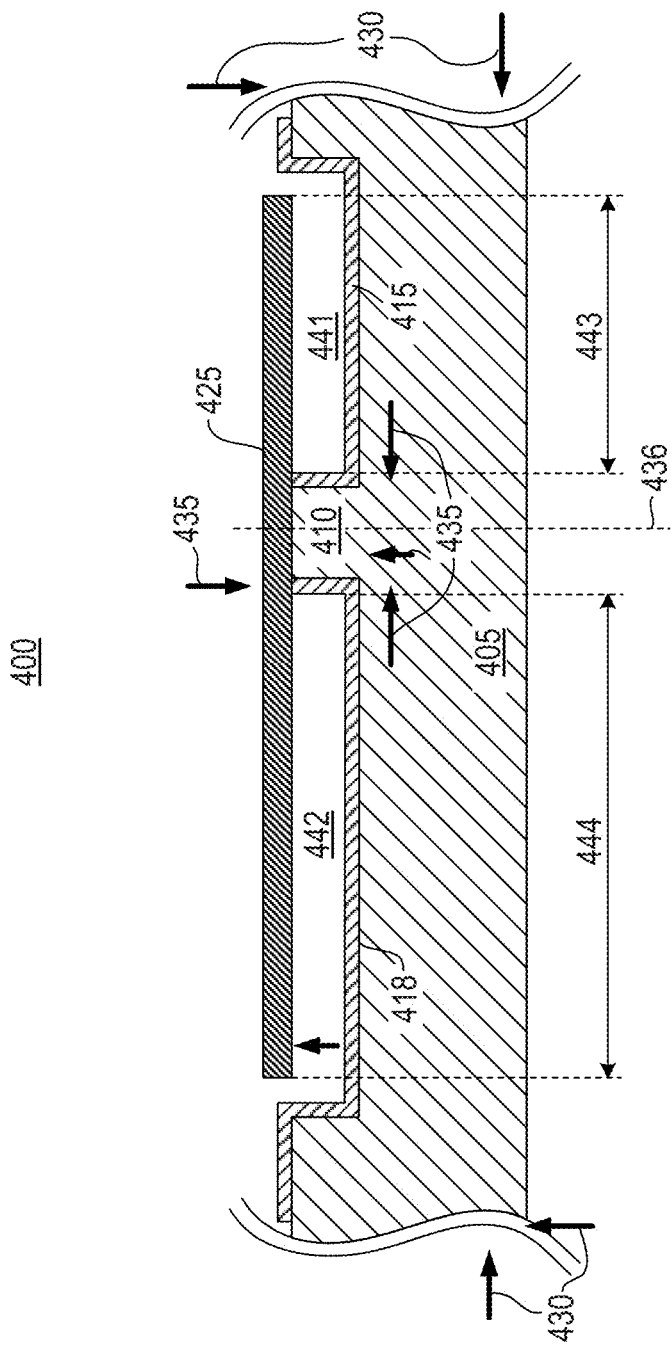
FIG. 4C is a diagram illustrating an acoustic resonator structure according to a representative embodiment.
Figure 4D:
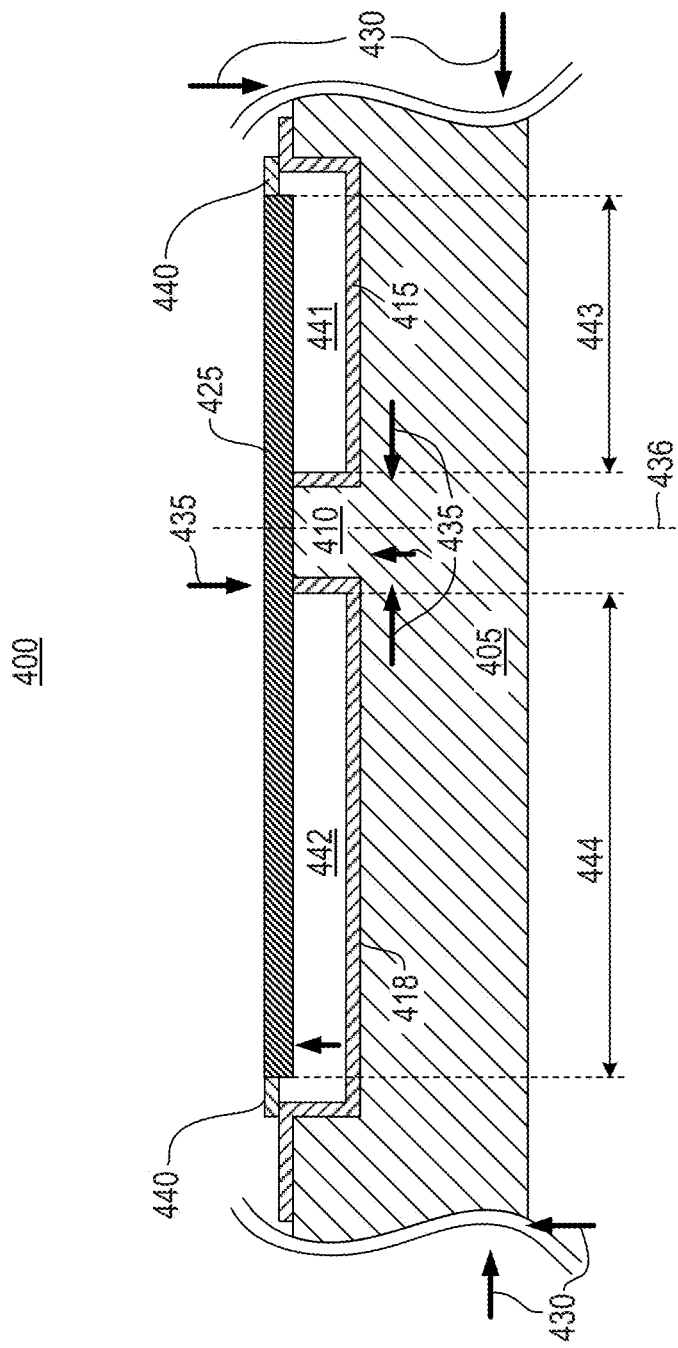
FIG. 4D is a diagram illustrating an acoustic resonator structure according to a representative embodiment.

In the embodiments depicted in and described in connection with FIGS. 4A and 4B, the pillar 410 is "centered" between trenches 420. As such, the acoustic resonator 425 is disposed symmetrically about a line 436 bisecting the pillar 410. In other embodiments contemplated by the present teachings, the pillar 410 is "offset" and the acoustic resonator 425 is not disposed symmetrically about line 436 bisecting the pillar. FIGS. 4C and 4D depict such representative embodiments. Off-setting the pillar is a form of 'apodization', where no two path lengths for lateral modes are the same. This causes a 'smearing' of the lateral modes. Notably, many details of the acoustic resonator structure 400 described in connection with FIGS. 4A and 4B are common to the representative embodiments described in connection with FIGS. 4C and 4D. These common details are often not repeated in the description of the representative embodiments described in connection with FIGS. 4C and 4D.

Referring to FIG. 4C, acoustic resonator structure 400 comprises substrate 405. A first trench 441 and a second trench 442 are formed in substrate 405, and pillar 410 is formed between first and second trenches 441,442.

First and second electrical contacts 415 and 418 are provided within first and second trenches 441, 442, and acoustic resonator 425 is formed above first and second trenches 441, 442 and pillar 410. Acoustic resonator 425 can be any type of bulk acoustic resonator. For example, acoustic resonator 425 can be an FBAR, DBAR, CRF, or ZDR. For explanation purposes however, acoustic resonator 425 is illustratively an FBAR. In addition, although not depicted in detail in FIG. 4C, acoustic resonator 425 comprises a lower electrode connected to a first contact on the pillar 410 that is connected to the first electrical contact 415, an upper electrode connected to a second contact on the pillar 410 that is connected to the second electrical contact 418, and a piezoelectric layer between the lower and upper electrodes. These electrodes can be connected to first and second electrical contacts 415 and 418 in a manner similar to the connection between first and second contacts 310 and 312 and lower and upper electrodes 315 and 325 in FIG. 3.

A force field from intrinsic and/or extrinsic stimuli creates forces 430 on substrate 405. These stimuli can be caused by various factors, such as thermal expansion or contraction of a PCB connected to acoustic resonator structure 400, or attachment of a package containing acoustic resonator structure 400 to the PCB.

Forces 430 are transmitted through silicon substrate to create forces 435 on pillar 410. However, because acoustic resonator 425 is connected to pillar 410 at a single location, forces 435 are unable to exert any appreciable torque on acoustic resonator 425. Consequently, forces 435 have minimal impact on the frequency of acoustic resonator 425. In other words, forces 435 have much less influence on the center frequency of acoustic resonator 425 compared with forces 130 of FIG. 1A.

As can be appreciated from a review of FIG. 4C, acoustic resonator 425 is not symmetrically disposed over the pillar 410. As such, the pillar 410 is offset relative to a center of the acoustic resonator 425. In the present embodiment, this is achieved by offsetting the pillar 410 so that a greater portion of the acoustic resonator 425 overhangs the second trench 442 than the first trench 441. As depicted in FIG. 4C, an overhang 443 from an exterior edge of the pillar 410 to the outer edge of the acoustic resonator 425 is less than an overhang 444 from the opposing exterior edge of the pillar 410 to the outer edge of the acoustic resonator 425. Stated somewhat differently, the acoustic resonator 425 is not disposed symmetrically about line 436, which bisects the pillar 410.

As depicted in FIG. 4C, one way of offsetting of the pillar 410 is effected by forming first trench 441 to be narrower than second trench 442. However, this is not essential as width of the first trench 441 could be the same as or even greater than the width of the second trench 442, as long as the overhang of the acoustic resonator on either side of the pillar 410 is not the same (e.g., overhang 443 is less than overhang 444).

Offsetting the pillar 410 and thereby providing an unequal overhang of the acoustic resonator 425 beneficially reduce spurious modes between the inner portion of the acoustic resonator 425 and the outer portion of the acoustic resonator 425. To this end, by offsetting the center of the acoustic resonator 425 (by offsetting the pillar 410 so that the overhangs 443,444 are not equal) no single eigenmode dominates. Rather, a plurality of orthogonal eigenmodes (e.g., cylindrical Bessel functions in the annular geometry of acoustic resonator 425) is supported. Ultimately, this results in a reduction of spurious modes in the acoustic resonator 425. This is a similar phenomenon to that realized by apodizing opposing sides of the electrodes of an acoustic resonator as is known to one of ordinary skill in the art.

FIG. 4D is a diagram illustrating a modified version of acoustic resonator structure 400 according to another representative embodiment. The structure shown in FIG. 4D is essentially identical to that illustrated in FIG. 4C, except that the structure of FIG. 4D further comprises tethers 440. Tethers 440 can be used to provide increased structural stability for acoustic resonator 425. Tethers 440 can be attached between first and second electrical contacts 415 and 418 and outer edges of acoustic resonator 425. Alternatively, the tethers 440 can be electrically isolated from the first and second electrical contacts 415 and 418. Moreover, tethers 440 can be connected to or formed by electrical traces (not shown) provided over the substrate 405 enabling selective electrical connections to be made to the acoustic resonator 425 suspended over the trench 420.

Figure 5:
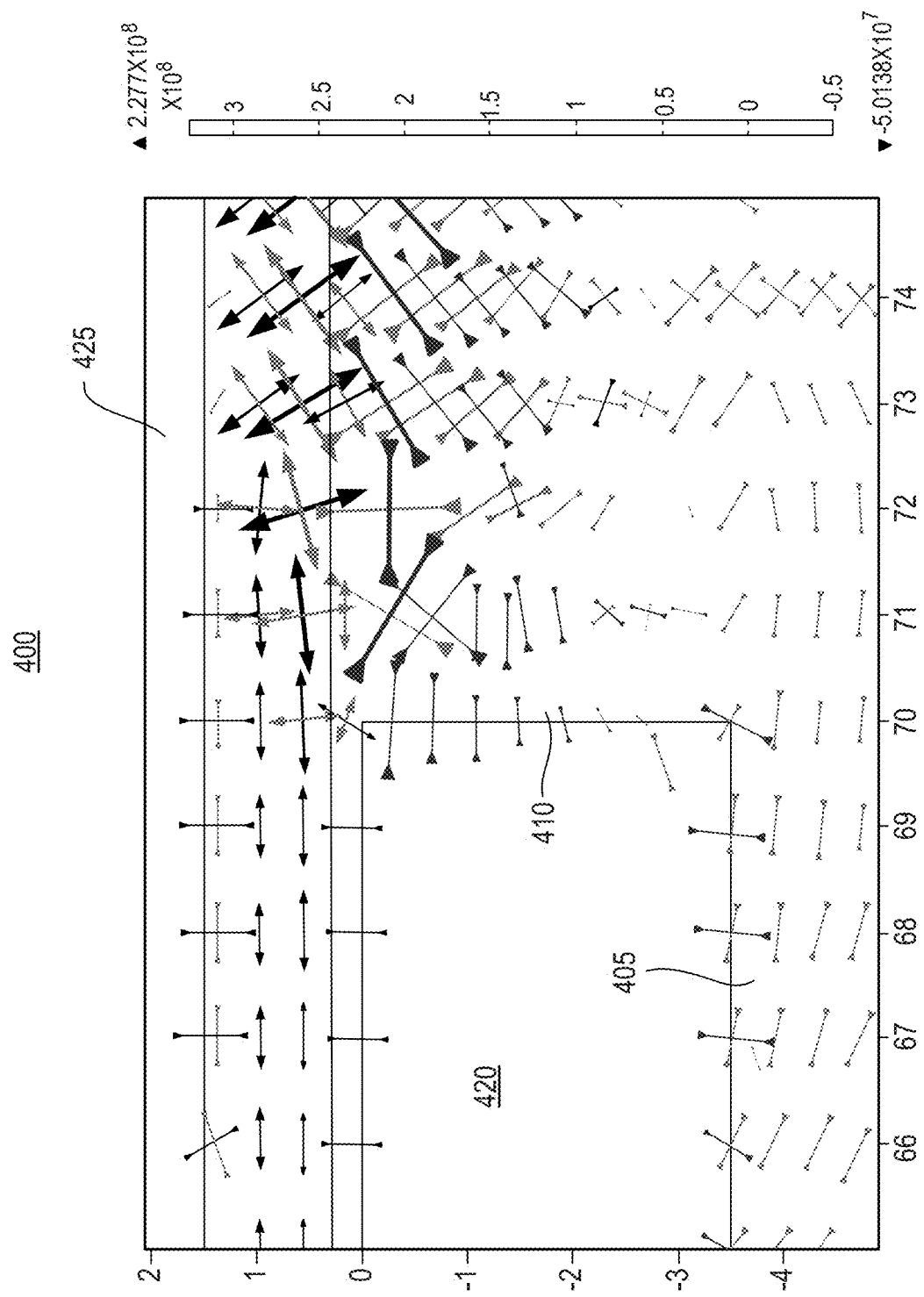
FIG. 5 is a diagram illustrating a simulation of forces transferred from a substrate to an acoustic resonator in the acoustic resonator structure of FIG. 4A.

FIG. 5 is a diagram illustrating a simulation of forces transferred from substrate 405 to acoustic resonator 425 in the acoustic resonator structure of FIG. 4A.

Referring to FIG. 5, forces applied to substrate 405 are transmitted upward through pillar 410. However, because pillar 410 is located at a point of zero lever moment with respect to acoustic resonator 425, substantially none of the forces are transmitted through acoustic resonator 425.

Figure 6B:
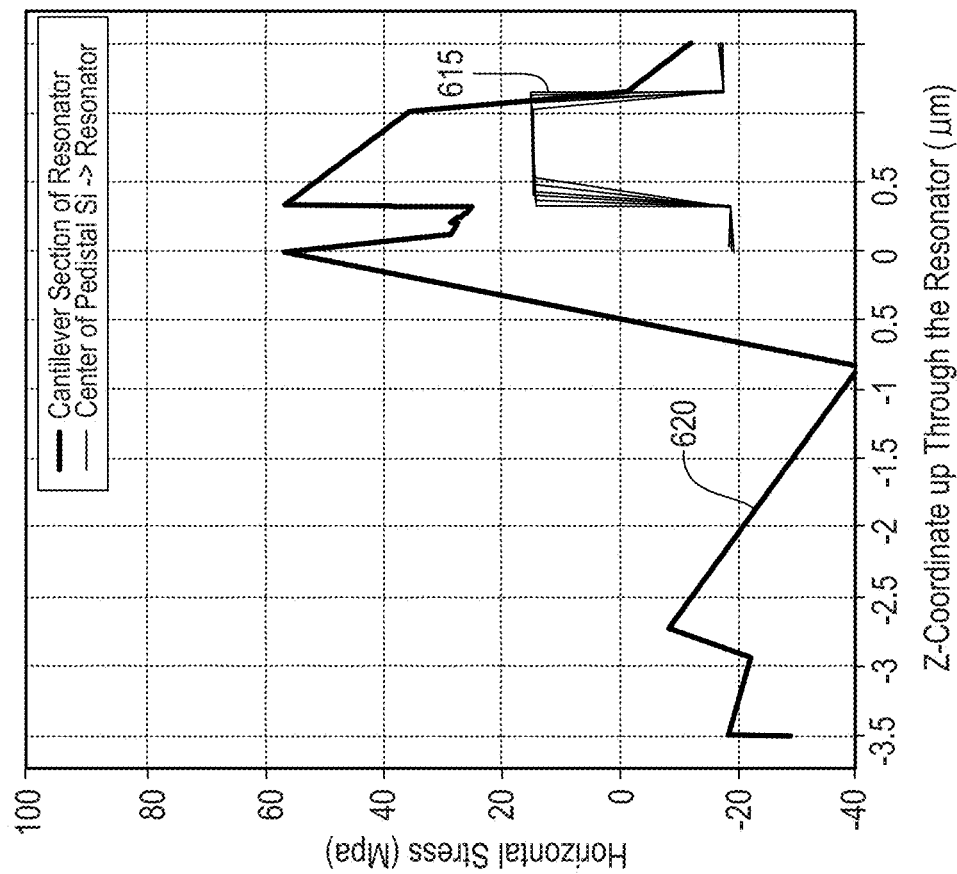
FIG. 6B is a graph illustrating stress in the structure of FIG. 6A as a function of a z-coordinate.
Figure 6A:
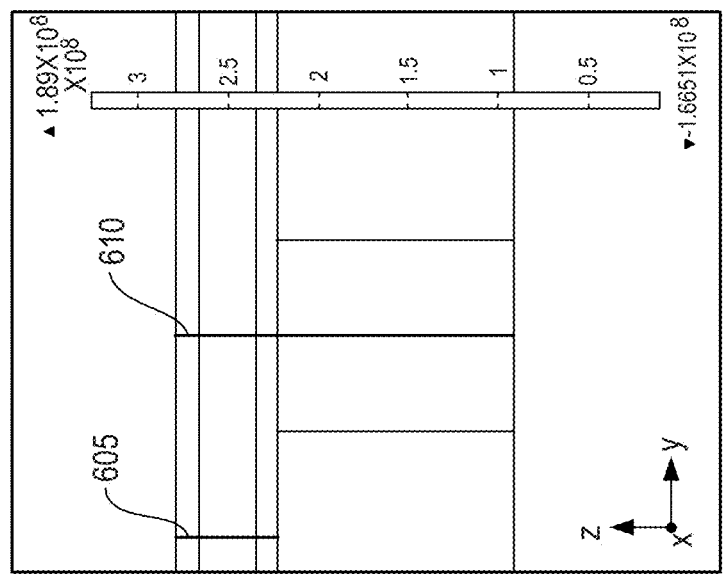
FIG. 6A is a diagram illustrating stress applied to an acoustic resonator and a pedestal according to a representative embodiment.

FIG. 6A is a diagram illustrating stresses applied to an acoustic resonator and a pedestal according to a representative embodiment. The stresses are indicated generally by shading, as shown in the embedded legend. In addition, two lines 605 and 610 are included in order to highlight stresses at specific cross-sectional locations of the resonator and pedestal, as explained with reference to FIG. 6B. Notably, the diagram depicted in FIG. 6A was realized using three-dimensional finite element simulations using known software, such as finite element simulation software commercially available from Comsol, Inc. USA.

FIG. 6B is a graph illustrating stresses along lines 605 and 610 in the structure of FIG. 6A. These stresses are plotted as a function of a z-coordinate. In other words, the stresses are plotted as a function of position along lines 605 and 610.

Referring to FIG. 6B, a first curve 615 illustrates stresses on the acoustic resonator of FIG. 6A as a function of z-coordinate along line 605. A second curve 620 illustrates stresses on the pedestal of FIG. 6A as a function of z-coordinate along line 610.

As indicated by FIG. 6B, the resonator experiences horizontal stresses of approximately −20 mega pascals (MPa) to approximately +15 MPa throughout its thickness. Meanwhile, the pedestal experiences horizontal stresses of up to approximately 55 MPa. Accordingly, the stresses along line 605 in the acoustic resonator are significantly weaker than the stresses along line 610 of the pedestal. This reduction of stress in the acoustic resonator can significantly reduce the amount of aging and related frequency drift in the resonator.

Figure 7A:
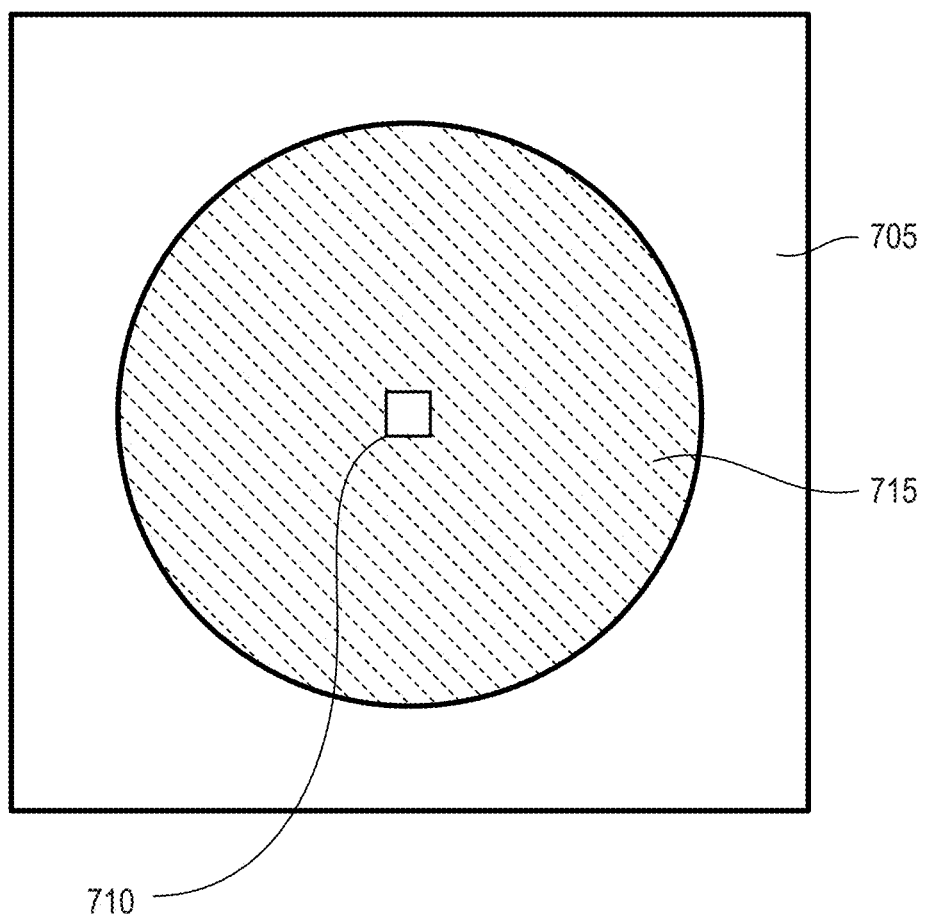
FIGS. 7A through 7K are diagrams illustrating a method of fabricating an acoustic resonator structure in accordance with a representative embodiment.

FIGS. 7A through 7K are diagrams illustrating a method of fabricating an acoustic resonator structure in accordance with a representative embodiment. FIG. 7A is a top view of a substrate 705 that forms the base of the acoustic resonator structure, and FIGS. 7B through 7J are cross-sectional views showing the formation of various features of the acoustic resonator structure on substrate 705. The method can be used to fabricate an acoustic resonator structure such as that illustrated in FIGS. 3 and 4. Notably, many of the materials, processing techniques and design considerations used in the presently described method of fabricating the acoustic resonator structure are disclosed in the U.S. Patents, U.S. Patent Application Publications, and U.S. Patent Applications incorporated by reference above.

Figure 7B:
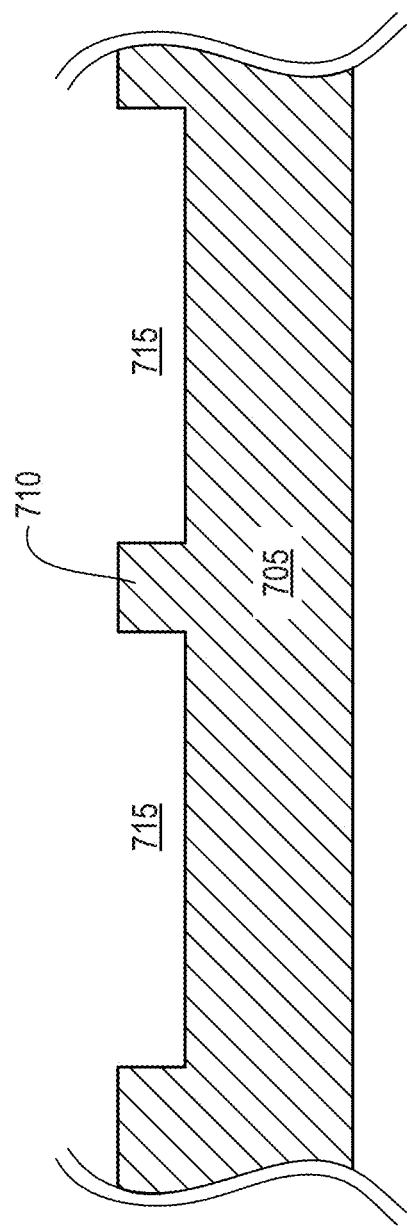

Referring to FIGS. 7A and 7B, the method begins by etching substrate 705 to form a trench 715 having a pillar 710. Illustratively, substrate 705 and pillar 710 comprise silicon or other suitable (e.g., semiconductor) material. Trench 715 forms an annulus around pillar 710 so that an acoustic resonator having an annular shape can be formed above trench 715 and over the pillar 710. Although trench 715 depicted has a substantially circular shape, this is merely illustrative, and the trench 715 it can also take other forms, such as by way of example, an elliptical shape, a square shape, a rectangular shape or an irregular shape. Illustratively, pillar 710 has a rectangular cross-sectional shape with a size (l×w) on the order of 16 μm×32 μm. As can be appreciated the pillar 710 has a height that is approximately equal to the depth of the trench 715

Figure 7C:
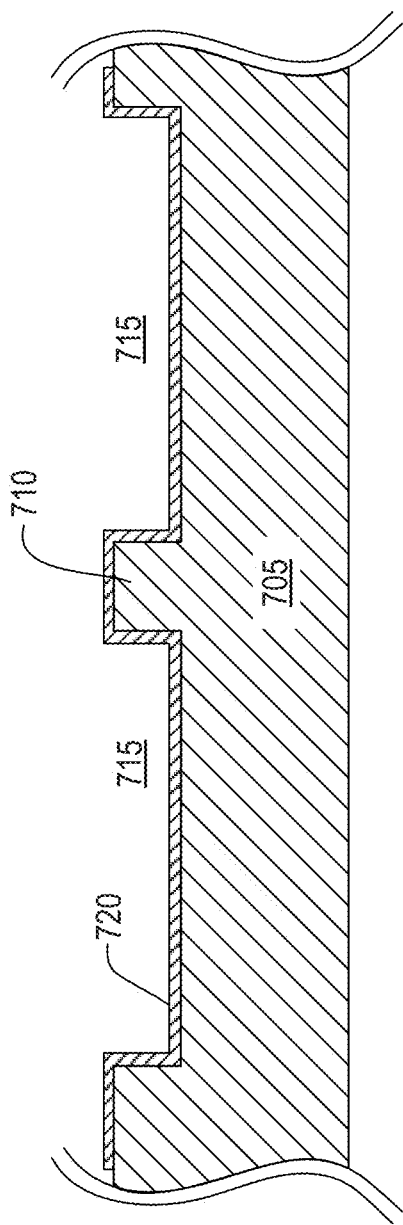
Figure 7D:
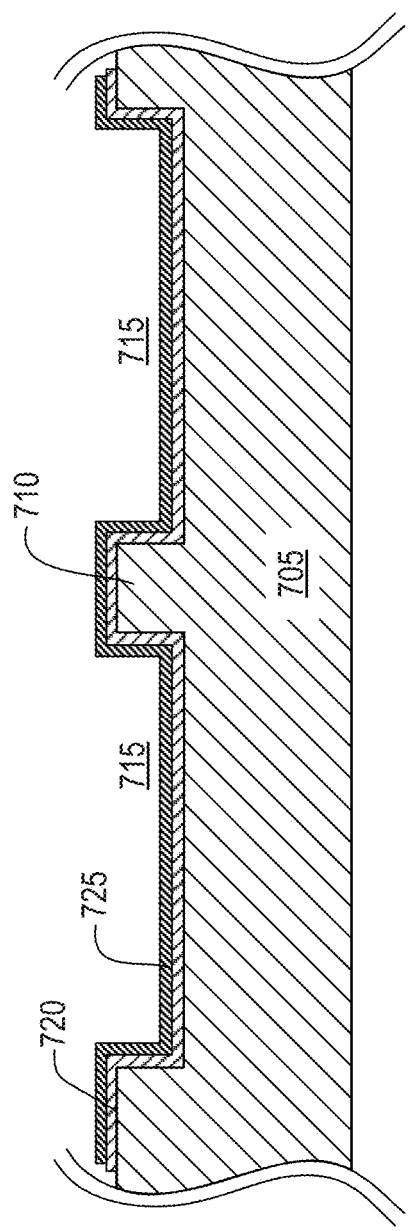

Referring to FIG. 7C, an electrically conductive layer 720 is formed in trench 715 and on substrate 705. Electrically conductive layer 720 is typically divided into two portions to provide separate conductive paths to respective lower and upper electrodes of an acoustic resonator. This can be accomplished, for example, by etching electrically conductive layer 720. In some embodiments, electrically conductive layer 720 comprises tungsten or molybdenum with a thickness of approximately 1 μm to approximately 2 μm. Electrically conductive layer 720 provides electrical connections (e.g., first and second electrical contacts 415, 418) between an acoustic resonator disposed on the pillar 710 (e.g., acoustic resonator 425) and circuitry (e.g., an integrated circuit not shown) on the substrate 705. In some embodiments, as illustrated in FIG. 7D, an etch stop layer 725 for chemical mechanical polishing (CMP) is formed in trench 715 and on substrate 705 before electrically conductive layer 720 is formed. Etch stop layer 725 can be formed of a suitable etch stop material such as AlN or silicon carbide.

Figure 7E:
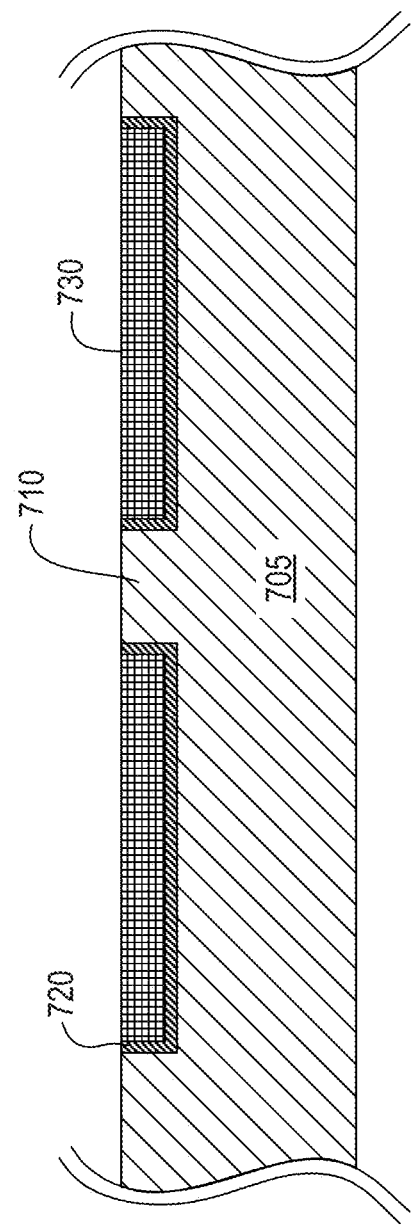

Referring to FIG. 7E, CMP is performed to remove electrically conductive layer 720 to the upper surface of substrate 705, but not from the trench 715 or sides of the pillar 710. Then, a sacrificial layer 730 of is provided in the trench 715 and over substrate 705, and CMP is again performed to remove portions of sacrificial layer 730 above substrate 705. As such, the sacrificial layer is substantially flush with the upper surface of the substrate. The sacrificial layer 730 is illustratively phosphosilicate glass (PSG) or other material such as described in one or more of the U.S. Patents, U.S. Patent Application Publications and U.S. Patent Applications incorporated by reference above.

Figure 7F:
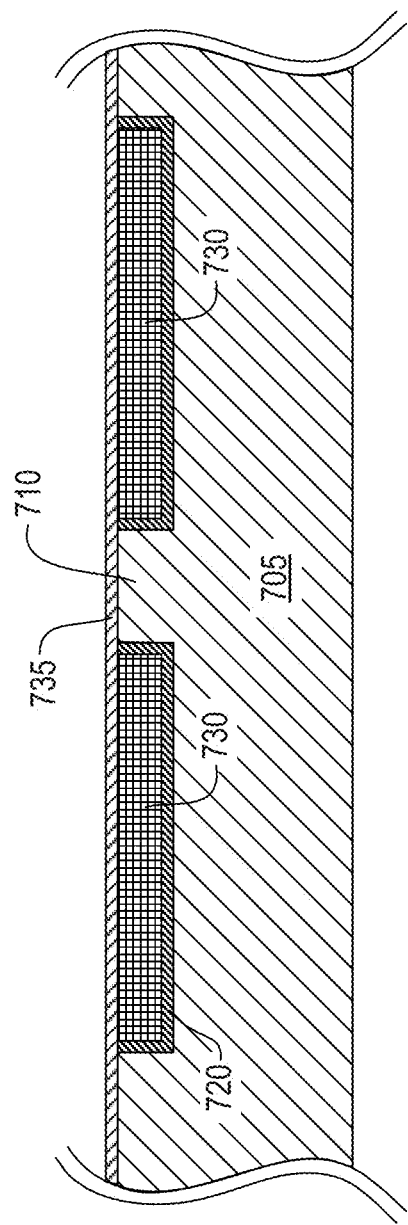

Referring to FIG. 7F, a seed layer (not shown) is deposited on sacrificial layer 730. Next, an electrically conductive layer 735 (e.g., molybdenum) is deposited on the seed layer. Electrically conductive layer 735 is used to form a lower electrode for the acoustic resonator. The seed layer provides a barrier to oxygen migration from the sacrificial layer 730 (e.g., PSG) through the lower electrode (formed from electrically conductive layer 735) and contaminating the piezoelectric layer during its deposition. Then, optionally, a temperature compensation layer (not shown) is formed on electrically conductive layer 735. The temperature compensation layer typically comprises borosilicate glass (BSG) or undoped silicate glass (USG). For simplicity of description, because the temperature compensation layer is located away from the pillar 710 and the outer edge of the acoustic resonator, it is not depicted.

Figure 7G:
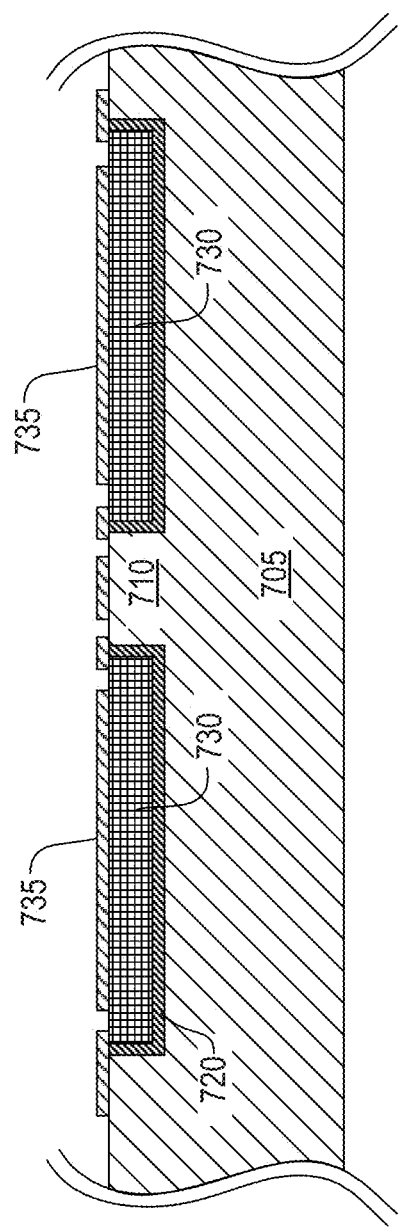

Referring to FIG. 7G, electrically conductive layer 735 is patterned at specific locations to define the lower electrode of the acoustic resonator, and to create a conductive path for connecting electrically conductive layer 720 to a upper electrode of the acoustic resonator (e.g., as depicted in FIG. 3). Although not shown in FIG. 7G, a temperature compensation layer typically remains on the structure shown.

Figure 7H:
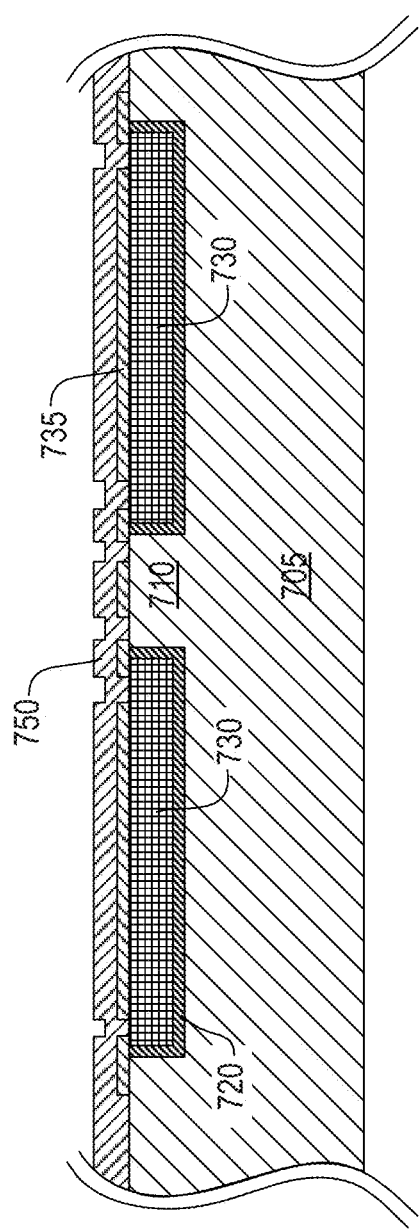

Referring to FIG. 7H, a piezoelectric layer 750 is deposited over electrically conductive layer 735. Piezoelectric layer 750 typically comprises a highly-textured c-axis piezoelectric material such as AlN or ZnO and provides the piezoelectric layer of the acoustic resonator of the representative embodiment.

Figure 7I:
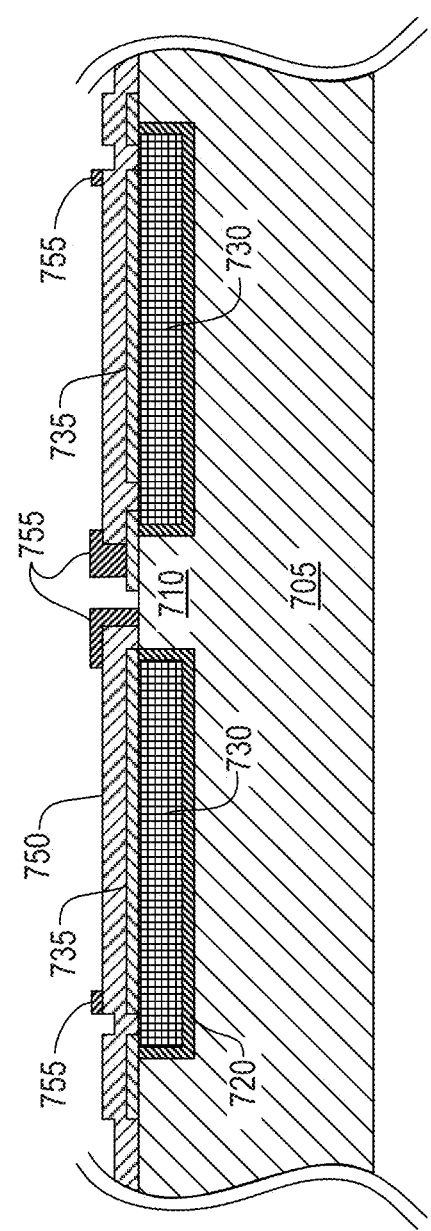

Referring to FIG. 7I, a layer of PSG or NEBSG is deposited on piezoelectric layer 750. The layer of PSG or NEBSG is then patterned to form spacer elements 755. In addition, a via (not shown) is formed to expose a portion of electrically conductive layer 735. The exposed portion of electrically conductive layer 735 can take the form of an island similar to island electrode 340 depicted in FIG. 3. The via can be used to form an electrical connection between the electrically conductive layer 720 and an upper electrode of the acoustic resonator.

Figure 7J:
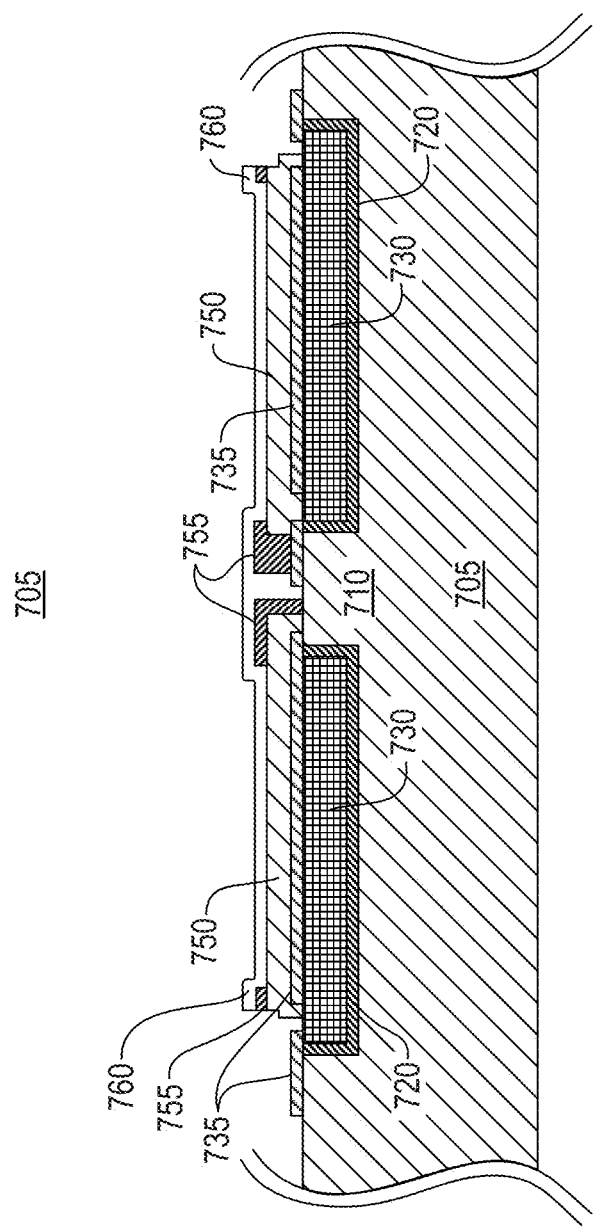

Referring to FIG. 7J, an electrically conductive layer (e.g., Mo) 760 is formed on piezoelectric layer 750 and over spacer elements 755. Electrically conductive layer 760 is used to form the upper electrode for the acoustic resonator. In addition, electrically conductive layer 760 fills the via to connect the upper electrode to electrically conductive layer 720. A passivation layer (not shown) is formed on the electrically conductive layer 760, and the passivation layer is patterned to form a passivation mask. Then, electrically conductive layer 760 is patterned using the passivation mask. This patterning defines the upper electrode of the acoustic resonator. Once the upper electrode is formed, the acoustic resonator has an active region defined by an overlap between the upper electrode, the lower electrode, and piezoelectric layer 750. Electrical contact pads 765 are then formed on electrically conductive layer 760. These electrical contact pads 765 are typically formed of a conductive material such as gold.

Figure 7K:
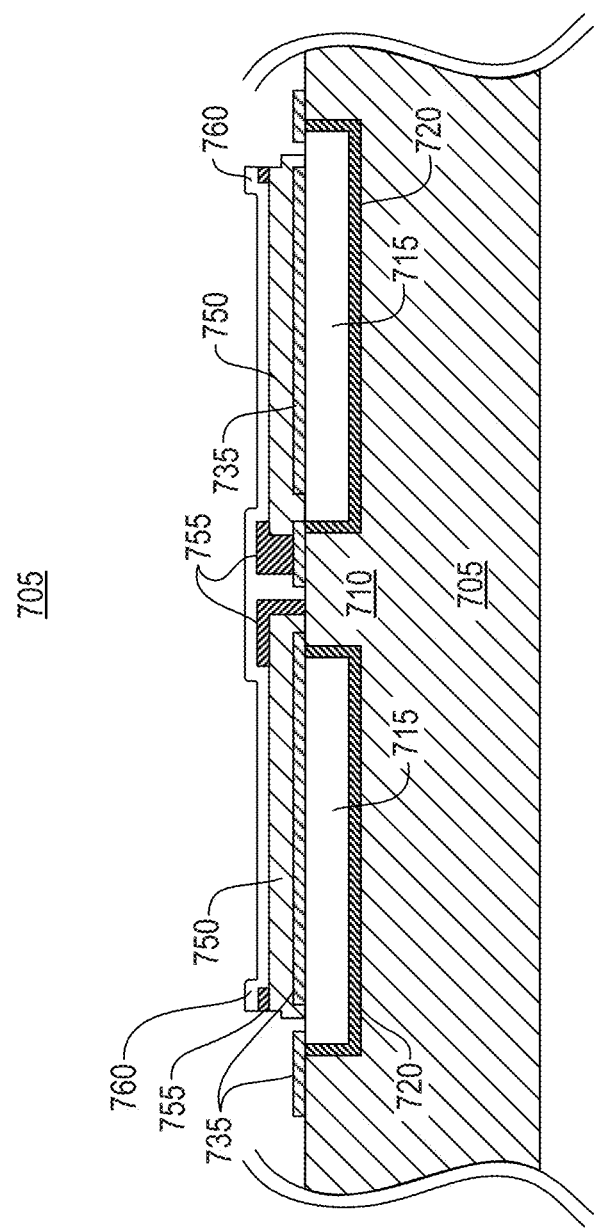

As depicted in FIG. 7K, sacrificial layer 730 is removed using a known method so that the acoustic resonator is suspended over the trench 715 and supported by pillar 710. This provides mechanical isolation for the acoustic resonator as described above, for example in connection with FIGS. 3 and 4, in order to substantially prevent the acoustic resonator from experiencing frequency drift due to stresses from external forces.

Figure 8:
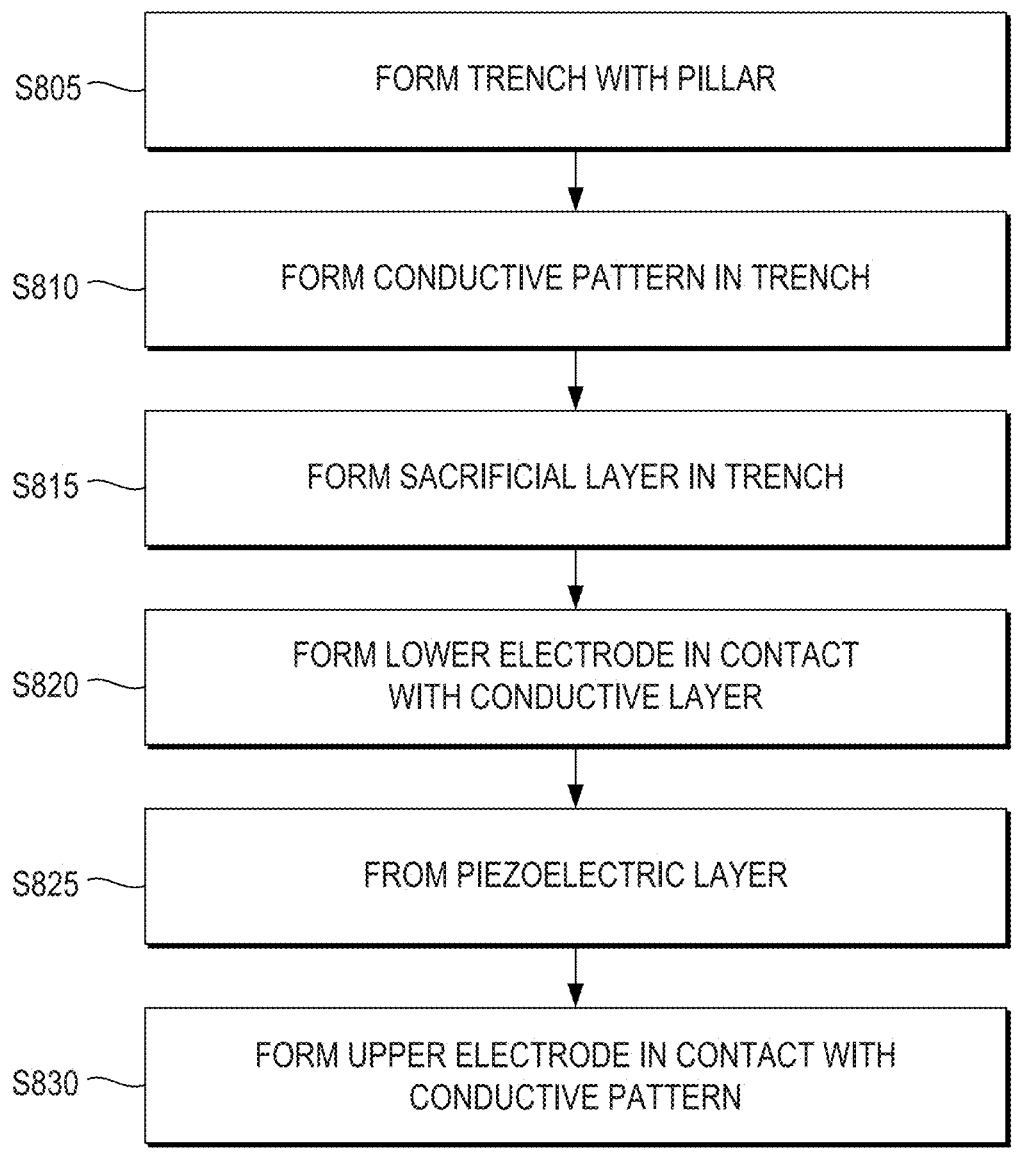
FIG. 8 is a flowchart illustrating a method of fabricating an acoustic resonator structure according to a representative embodiment.

FIG. 8 is a flowchart illustrating a method of fabricating an acoustic resonator structure according to a representative embodiment. The method of FIG. 8 is similar to the method described with reference to FIGS. 7A through 7J, and it will be described with occasional reference to those figures. In the description of FIG. 8, example method steps are indicated by parentheses (SXXX) to distinguish them from example apparatus features.

Referring to FIG. 8, the method begins by forming a trench having a pillar in a silicon substrate (S805). Next, the method forms a conductive pattern in the trench (S810). The conductive pattern comprises a first part used to provide an electrical connection to a lower electrode of the acoustic resonator structure, and a second part used to provide an electrical connection to an upper electrode of the acoustic resonator structure. The conductive pattern can be formed, for example, by depositing a layer of tungsten in the trench and the removing portions of the tungsten layer from upper surfaces of the silicon substrate.

Next, a sacrificial layer (e.g., PSG) layer is formed in the trench (S815), and the sacrificial layer is planarized to the top surface of the silicon substrate. The sacrificial layer is typically removed subsequently to form an air gap in the acoustic resonator structure. In addition, the sacrificial layer serves to support other features during fabrication.

A lower electrode is formed on the silicon substrate and in contact with the conductive pattern (S820). The contact between the lower electrode and the conductive pattern can be made, for example, like the contact in FIG. 3 between lower electrode 315 and second contact 312.

Next, a piezoelectric layer is formed over the lower electrode (S825), and the piezoelectric layer is patterned to create a via extending to the second part of the conductive pattern. Then, an upper electrode is formed over the piezoelectric layer (S830). The upper electrode is electrically connected to the second part of the conductive pattern through the via, and the PSG layer is removed so that the acoustic resonator comprising the lower electrode, the piezoelectric layer, and the upper electrode is suspended over an air gap located in the trench.

While example embodiments are disclosed herein, one of ordinary skill in the art will appreciate that many variations that are in accordance with the present teachings are possible and remain within the scope of the appended claims. The invention therefore is not to be restricted except within the scope of the appended claims.

The invention claimed is:

1. An acoustic resonator structure, comprising:
a substrate comprising a trench;
a conductive pattern disposed in the trench;
a pillar disposed within the trench; and
an acoustic resonator supported by the pillar and suspended over the trench, the acoustic resonator comprising: a lower electrode electrically connected to a first part of the conductive pattern; an upper electrode connected to a second part of the conductive pattern through a via located above the pillar; and a piezoelectric layer located between the lower electrode and the upper electrode.

2. The acoustic resonator structure of claim 1, further comprising a spacer disposed between the piezoelectric layer and the upper electrode, wherein the spacer comprises non-etchable borosilicate glass (NEBSG) or an air gap.

3. The acoustic resonator structure of claim 1, wherein the acoustic resonator comprises a film bulk acoustic resonator (FBAR).

4. The acoustic resonator structure of claim 1, wherein the acoustic resonator has an annular shape arranged around the pillar.

5. The acoustic resonator structure of claim 4, wherein the annular shape comprises an overlap of the upper electrode and the lower electrode that does not overlap the pillar.

6. The acoustic resonator structure of claim 1, wherein the acoustic resonator is supported by the pillar at a center of the acoustic resonator, or the acoustic resonator is supported by the pillar at a location offset relative to the center of the acoustic resonator.

7. The acoustic resonator structure of claim 1, wherein the acoustic resonator has an active region that is suspended entirely over the trench.

8. The acoustic resonator structure of claim 1, further comprising a tether connecting an edge of the acoustic resonator to a portion of the substrate.

9. The acoustic resonator structure of claim 8, wherein the tether is connected to an electrical trace on the substrate.

10. The acoustic resonator structure of claim 8, wherein the tether becomes an electrical connection to a trace on the substrate.

11. The acoustic resonator structure of claim 1, further comprising an integrated circuit coupled to the acoustic resonator.

12. The acoustic resonator structure of claim 1, further comprising a silicon microcap disposed over the substrate and covering the acoustic resonator.

13. The acoustic resonator structure of claim 1, wherein the lower electrode is in direct contact with the first part of the conductive pattern and is electrically isolated from the second part of the conductive pattern.

14. The acoustic resonator structure of claim 1, wherein the conductive pattern comprises tungsten or molybdenum, and the lower and upper electrodes each comprise tungsten or molybdenum.

15. The acoustic resonator structure of claim 1, wherein the substrate comprises silicon, and the pillar is formed integral to the substrate.

16. The acoustic resonator structure of claim 1, wherein the pillar comprises a thermally resistant oxide.

17. A method of fabricating an acoustic resonator structure, comprising:
    forming a trench in a substrate;
    forming a pillar in a central portion of the trench;
    forming a conductive pattern in the trench;
    forming an acoustic resonator supported by the pillar, and an active region formed around the pillar and suspended over the trench, the forming the active region comprising: forming a sacrificial layer in the trench; forming a lower electrode on the sacrificial layer and connected to a first part of the conductive pattern; forming a piezoelectric layer on the lower electrode; forming an upper electrode on the piezoelectric layer; forming an electrical connection from the upper electrode to a second part of the conductive pattern by depositing a conductive material in a via formed above the pillar; and removing the sacrificial layer from the trench.

18. The method of claim 17, wherein the pillar is formed integral to the substrate, and forming the pillar comprises etching the substrate in a region defining the trench such that the pillar remains in a central portion of the trench.

19. The method of claim 18, wherein the acoustic resonator is a film bulk acoustic resonator (FBAR).

20. The method of claim 17, further comprising:
    forming a tether to connect an edge of the acoustic resonator to a portion of the substrate at an edge of the trench.

21. The method of claim 20, further comprising forming a spacer between the piezoelectric layer and the upper electrode, wherein the spacer comprises a non-etchable borosilicate glass (NEBSG) or an air gap.

22. An acoustic resonator structure, comprising:
    a substrate comprising a trench;
    a pillar disposed within the trench, the pillar comprising a material that is substantially electrically non-conductive;
    a conductive pattern disposed over the trench, the conductive pattern comprising: a first contact disposed over a first side of the trench and over a first side of the pillar; and a second contact disposed over a second side of the trench and over a second side of the pillar, wherein the first contact is electrically isolated from the second contact; and
    an acoustic resonator supported by the pillar and suspended over the trench.

23. The acoustic resonator structure of claim 22, wherein the acoustic resonator comprises a film bulk acoustic resonator (FBAR).

24. The acoustic resonator structure of claim 23, wherein the acoustic resonator has an annular shape arranged around the pillar.

25. The acoustic resonator structure of claim 24, wherein the annular shape comprises an overlap of the upper electrode and the lower electrode that does not overlap the pillar.

26. The acoustic resonator structure of claim 23, wherein the acoustic resonator is either supported by the pillar at a center of the acoustic resonator or at a location that is offset relative to the center of the acoustic resonator.

27. The acoustic resonator structure of claim 23, further comprising a tether connecting an edge of the acoustic resonator to a portion of the substrate.

28. The acoustic resonator structure of claim 27, wherein the tether is connected to an electrical trace on the substrate.

29. The acoustic resonator structure of claim 23, further comprising an integrated circuit coupled to the acoustic resonator.

30. The acoustic resonator structure of claim 23, further comprising a silicon microcap disposed over the substrate and covering the acoustic resonator.

31. The acoustic resonator structure of claim 23, wherein the substrate comprises silicon, and the pillar is formed integral to the substrate.

32. The acoustic resonator structure of claim 23, wherein the pillar comprises a thermally resistant oxide.

33. The acoustic resonator of claim 22, wherein the acoustic resonator comprises: a first electrode that is electrically connected to the first contact; and a second electrode that is electrically connected to the second contact.

\* \* \* \* \*